United States Patent
Kato et al.

(10) Patent No.: US 6,930,326 B2
(45) Date of Patent: Aug. 16, 2005

(54) SEMICONDUCTOR CIRCUIT AND METHOD OF FABRICATING THE SAME

(75) Inventors: Kiyoshi Kato, Sagamihara (JP); Tomoaki Atsumi, Atsugi (JP); Atsuo Isobe, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 83 days.

(21) Appl. No.: 10/395,202

(22) Filed: Mar. 25, 2003

(65) Prior Publication Data

US 2003/0186490 A1 Oct. 2, 2003

(30) Foreign Application Priority Data

Mar. 26, 2002 (JP) ......................................... 2002-087208

(51) Int. Cl.[7] ........................ H01L 29/04; H01L 31/036; H01L 31/0376; H01L 31/20
(52) U.S. Cl. ............................ 257/59; 257/55; 257/56; 257/57; 257/58; 257/60; 257/61; 257/62; 257/63; 257/64; 257/65; 257/66; 257/67; 257/347; 438/149; 438/150; 438/479; 438/482; 438/483; 438/489; 438/485; 438/486
(58) Field of Search ..................... 257/59, 347, 55–67; 438/149, 150, 479, 482–86

(56) References Cited

U.S. PATENT DOCUMENTS

| | | |
|---|---|---|
| 4,330,363 A | 5/1982 | Biegesen et al. |
| 5,097,297 A | 3/1992 | Nakazawa |
| 5,163,220 A | 11/1992 | Zeto et al. |
| 5,432,122 A | 7/1995 | Chae |
| 5,636,042 A | 6/1997 | Nakamura et al. |
| 5,643,826 A | 7/1997 | Ohtani et al. |
| 5,747,828 A | 5/1998 | Hata et al. |
| 5,828,082 A | 10/1998 | Wu |

(Continued)

FOREIGN PATENT DOCUMENTS

| | | |
|---|---|---|
| EP | 1 049 144 | 11/2002 |
| JP | 62-104117 | 5/1987 |

(Continued)

OTHER PUBLICATIONS

M.W. Geis, et al., *Crystallographic Orientation of Silicon on an Amorphous Substrate Using an Artificial Surface–Relief Grating and Laser Crystallization*, 1979 American Institute of Physics, Appl. Phys. Lett. 35(1), Jul. 1, 1979, pp. 71–74.

(Continued)

*Primary Examiner*—Allan R. Wilson
*Assistant Examiner*—Edgardo Ortiz
(74) *Attorney, Agent, or Firm*—Eric J. Robinson; Robinson Intellectual Property Law Office, P.C.

(57) ABSTRACT

According to the invention, a plurality of semiconductor devices which are required to have conformance are formed from crystalline semiconductor films having uniform crystallinity on the same line, and a semiconductor circuit in which variation between semiconductor devices is small can be provided, and a semiconductor integrated circuit having high conformance can be provided. The invention is characterized in that, in a part or whole of thin film transistors which configure an analog circuit such as a current mirror circuit, a differential amplifier circuit, or an operational amplifier, in which high conformance is required for semiconductor devices included therein, channel forming regions have crystalline semiconductor films on the same line. High conformance can be expected for an analog circuit which has the crystalline semiconductor films on the same line formed using the invention as the channel forming regions of the thin film transistors. That is, the invention is characterized in that, among the thin film transistors which configures the analog circuit, the channel forming regions of the thin film transistors having at least the same polarity are formed on the same line.

48 Claims, 18 Drawing Sheets

U.S. PATENT DOCUMENTS

| | | | |
|---|---|---|---|
| 5,841,097 A | 11/1998 | Esaka et al. | |
| 5,847,780 A | 12/1998 | Kim et al. | |
| 5,854,803 A | 12/1998 | Yamazaki et al. | |
| 5,858,823 A | 1/1999 | Yamazaki et al. | |
| 5,893,730 A | 4/1999 | Yamazaki et al. | |
| 5,932,893 A | 8/1999 | Miyanaga et al. | |
| 5,953,597 A | 9/1999 | Kusumoto et al. | |
| 5,965,915 A | 10/1999 | Yamazaki et al. | |
| 5,981,974 A | 11/1999 | Makita | |
| 5,986,306 A | 11/1999 | Nakajima et al. | |
| 6,204,520 B1 | 3/2001 | Ha et al. | |
| 6,210,996 B1 | 4/2001 | Yamazaki et al. | |
| 6,274,414 B1 | 8/2001 | Ogata et al. | |
| 6,291,320 B1 | 9/2001 | Yamazaki et al. | |
| 6,294,815 B1 | 9/2001 | Yamazaki et al. | |
| 6,300,175 B1 | 10/2001 | Moon | |
| 6,307,214 B1 | 10/2001 | Ohtani et al. | |
| 6,323,072 B1 * | 11/2001 | Yamazaki et al. | 438/166 |
| 6,326,249 B1 | 12/2001 | Yamazaki et al. | |
| 6,355,940 B1 | 3/2002 | Koga et al. | |
| 6,365,933 B1 | 4/2002 | Yamazaki et al. | |
| 6,380,560 B1 * | 4/2002 | Yamazaki et al. | 257/72 |
| 6,388,386 B1 | 5/2002 | Kunii et al. | |
| 6,410,368 B1 | 6/2002 | Kawasaki et al. | |
| 6,424,331 B1 | 7/2002 | Ozawa | |
| 6,429,100 B2 | 8/2002 | Yoneda | |
| 6,433,842 B1 | 8/2002 | Kaneko et al. | |
| 6,475,840 B1 | 11/2002 | Miyanaga et al. | |
| 6,492,659 B1 * | 12/2002 | Yamazaki et al. | 257/59 |
| 6,512,246 B1 | 1/2003 | Tanabe | |
| 6,528,397 B1 | 3/2003 | Taketomi et al. | |
| 6,583,440 B2 | 6/2003 | Yasukawa | |
| 6,632,696 B2 | 10/2003 | Kimura et al. | |
| 2001/0035526 A1 | 11/2001 | Yamazaki et al. | |
| 2002/0004292 A1 | 1/2002 | Yamazaki et al. | |
| 2002/0048864 A1 | 4/2002 | Yamazaki et al. | |
| 2002/0075208 A1 | 6/2002 | Bae et al. | |
| 2002/0098628 A1 | 7/2002 | Hamada et al. | |
| 2002/0134981 A1 | 9/2002 | Nakamura et al. | |
| 2003/0001800 A1 | 1/2003 | Nakajima et al. | |
| 2003/0128200 A1 | 7/2003 | Yumoto | |
| 2003/0141505 A1 | 7/2003 | Isobe et al. | |
| 2003/0141521 A1 | 7/2003 | Isobe et al. | |
| 2003/0181043 A1 | 9/2003 | Tanada et al. | |
| 2003/0183854 A1 | 10/2003 | Kato et al. | |
| 2003/0183875 A1 | 10/2003 | Isobe et al. | |
| 2003/0209710 A1 | 11/2003 | Yamazaki et al. | |
| 2003/0218169 A1 | 11/2003 | Isobe et al. | |
| 2003/0218170 A1 | 11/2003 | Yamazaki et al. | |
| 2003/0218171 A1 | 11/2003 | Isobe et al. | |
| 2003/0218177 A1 | 11/2003 | Yamazaki | |
| 2003/0219935 A1 | 11/2003 | Miyairi et al. | |
| 2003/0230749 A1 | 12/2003 | Isobe et al. | |
| 2003/0230750 A1 | 12/2003 | Koyama et al. | |
| 2004/0016958 A1 | 1/2004 | Kato et al. | |
| 2004/0016967 A1 | 1/2004 | Yamazaki et al. | |
| 2004/0026696 A1 * | 2/2004 | Yamazaki et al. | 257/66 |
| 2004/0072411 A1 * | 4/2004 | Azami et al. | 438/482 |

FOREIGN PATENT DOCUMENTS

| | | |
|---|---|---|
| JP | 06-349735 | 12/1994 |
| JP | 07-130652 | 5/1995 |
| JP | 08-070129 | 3/1996 |
| JP | 08-195357 | 7/1996 |
| JP | 10-135468 | 5/1998 |
| JP | 10-135469 | 5/1998 |
| JP | 11-084418 | 3/1999 |
| JP | 11-354442 | 12/1999 |
| JP | 2000-068520 | 3/2000 |
| JP | 2000-349296 | 12/2000 |
| JP | 2001-011085 | 1/2001 |
| JP | 2001-144027 | 5/2001 |
| JP | 2002-014337 | 1/2002 |
| JP | 2002-313811 | 10/2002 |
| JP | 2002-324808 | 11/2002 |

OTHER PUBLICATIONS

M.W. Geis, et al., *Crystalline Silicon on Insulators by Graphoepitaxy*, IEEE 1979, pp. 210–212.

A. Hara et al., *Ultra–High Performance Poly–Si TFTs on a Glass by a Stable Scanning CW Laser Lateral Crystallization*, AM–LCD, Jan. 1, 2001, pp. 227–230.

H. Smith et al., *Oriented Crystal Growth on Amorphous Substrates Using Artificial Surface–Relief Gratings*, Appl. Phys. Lett., vol. 32, No. 6, Mar. 15, 1978, pp. 349–350.

D.K. Biegelsen et al., *Laser–Induced Crystallization of Silicon Islands on Amorphous Substrates: Multilayer Structures*, Appl. Phys. Lett., vol. 38, No. 3, Feb. 1, 1981, pp. 150–152.

M.A. Baldo et al., *Very High–Efficiency Green Organic Light–Emitting Devices Based on Electrophosphorescence*, Applied Physics Letters, vol. 75, No. 1, Jul. 5, 1999, pp. 4–6.

H.W. Lam, *Characteristics of MOSFETS Fabricated in Laser–Recrystallized Polysilicon Islands with a Retaining Wall Structure on an Insulating Substrate*, IEEE Electron Device Letters, vol. EDL–1, No. 10, Oct., 1980, pp. 206–208.

M.W. Geis et al., *Grapho–Epitaxy of Silicon on Fused Silica Using Surface Micropatterns and Laser Crystallization*, J. Vac. Sci. Technol., vol. 16, No. 6, Nov./Dec., 1979, pp. 1640–1643.

T. Tsutsui et al., *High Quantum Efficiency in Organic Light–Emitting Devices with Iridium–Complex as a Triplet Emissive Center*, Jpn. J. Appl. Phys., vol. 38, Part 2, No. 12B, Dec. 15, 1999, pp. L1502–L1504.

M.A. Baldo, *Highly Efficient Phosphorescent Emission from Organic Electroluminescent Devices*, Nature, vol. 395, Sep. 10, 1998, pp. 151–154.

T. Tsutsui et al., *Electroluminescence in Organic Thin Films*, Photochemical Processes in Organized Molecular Systems, Proceedings of the Memorial Conference for the late Professor Shigeo Tazuke, Sep. 22–24, 1990, pp. 437–450.

M. Kishino et al., *Physics of VLSI Device*, Maruzen Co., Ltd., 1995, pp. 144–146.

* cited by examiner

Fig. 7A  d<a2, W1 and W2 are almost equal to 1μm or less.
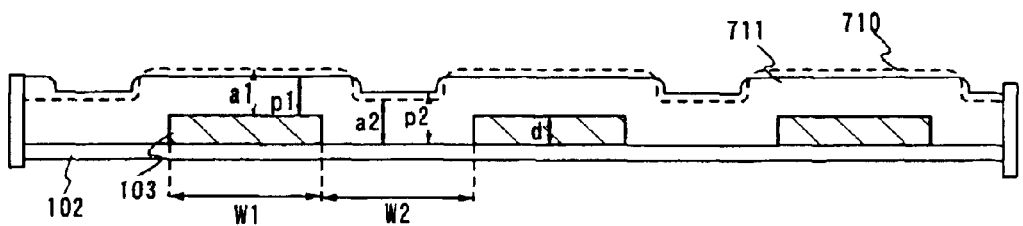
Fig. 7B  d≧a2, W1 and W2 are almost equal to 1μm or less.
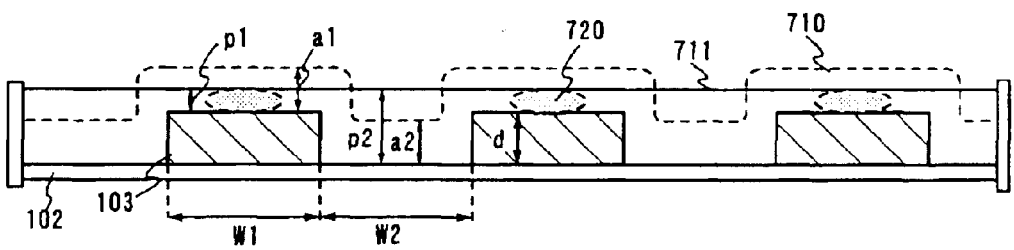
Fig. 7C  d>a2, W1 and W2 are almost equal to 1μm or less.
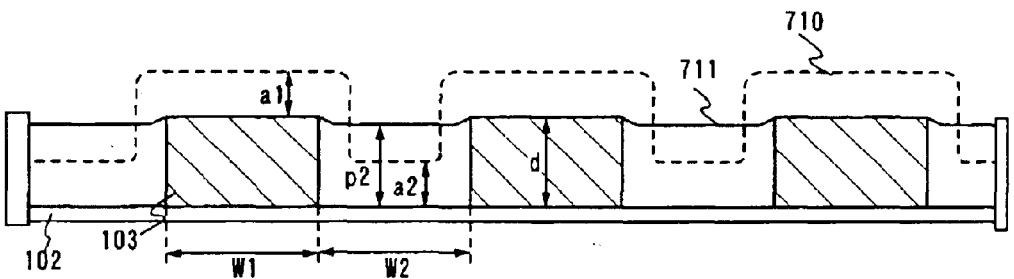
Fig. 7D  d≧a2, W1 and W2 are almost equal to 1μm or a little more.
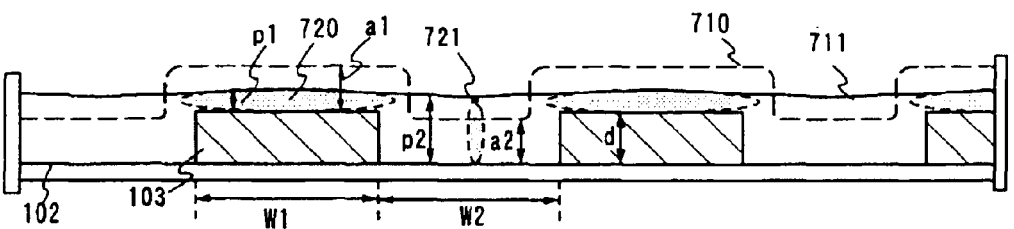
Fig. 7E  d≧a2, W1 and W2 are almost equal to 1μm or more.
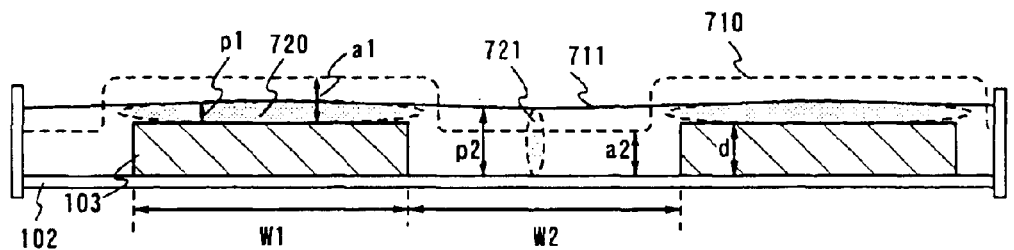

Fig. 13A
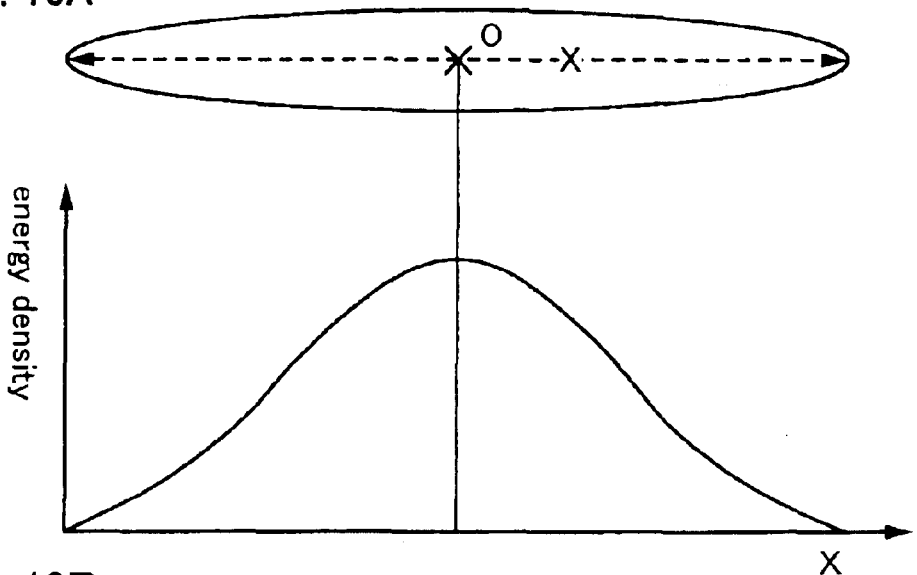
Fig. 13B
Fig. 13C
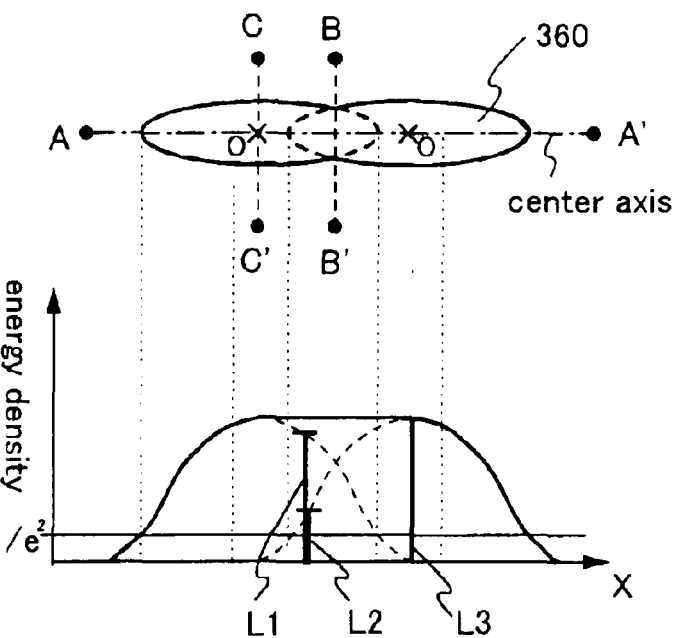
Fig. 13D  energy density distribution along A—A' line Fig. 14A-1
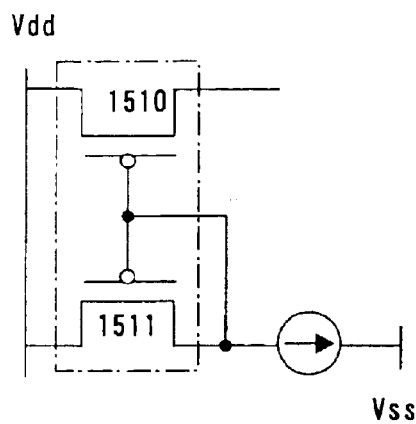
Fig. 14A-2
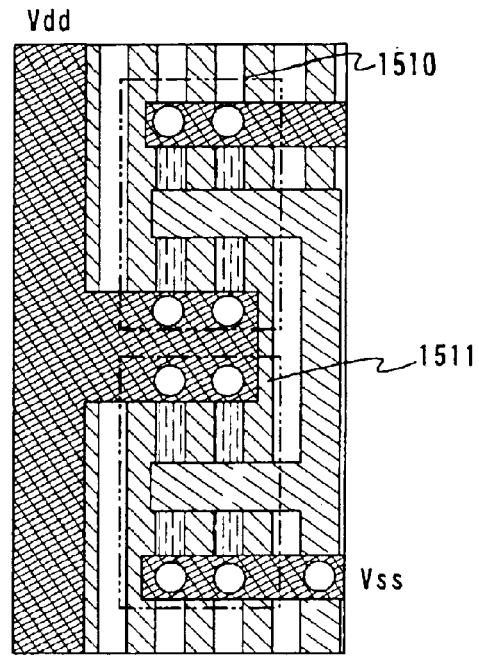
Fig. 14B-1
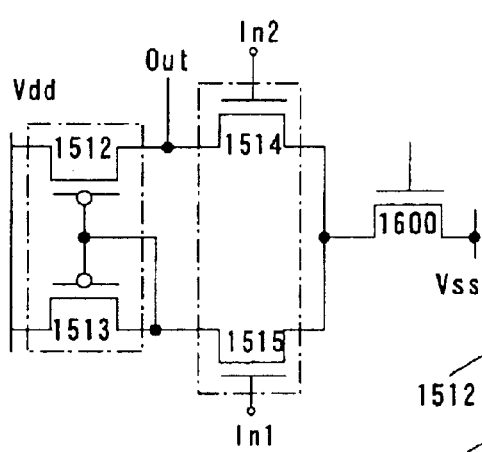
Fig. 14B-2
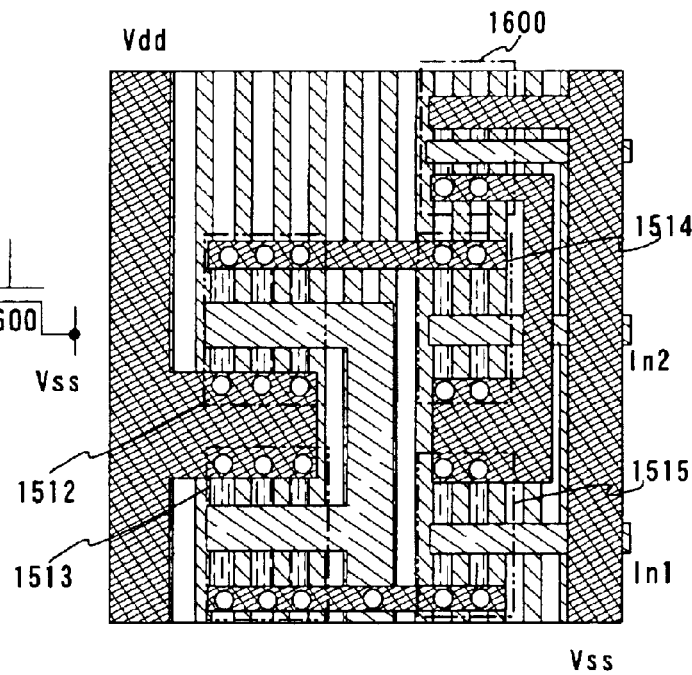
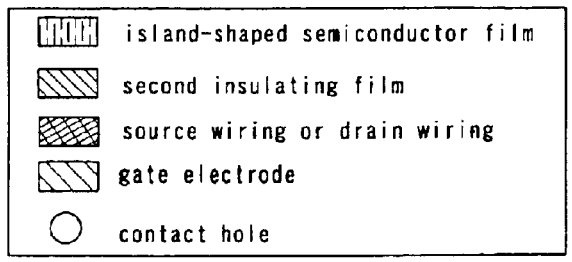

Fig. 15A
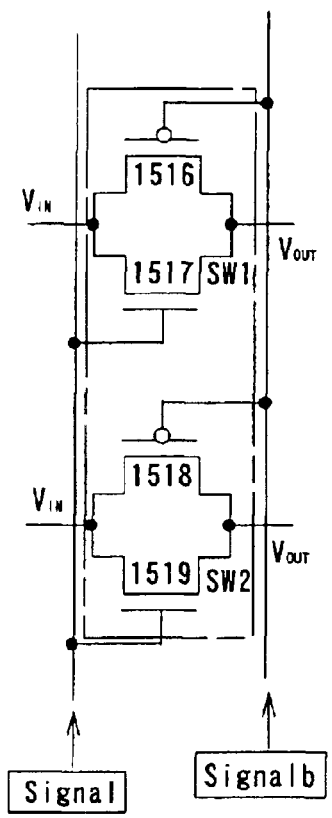
Fig. 15B
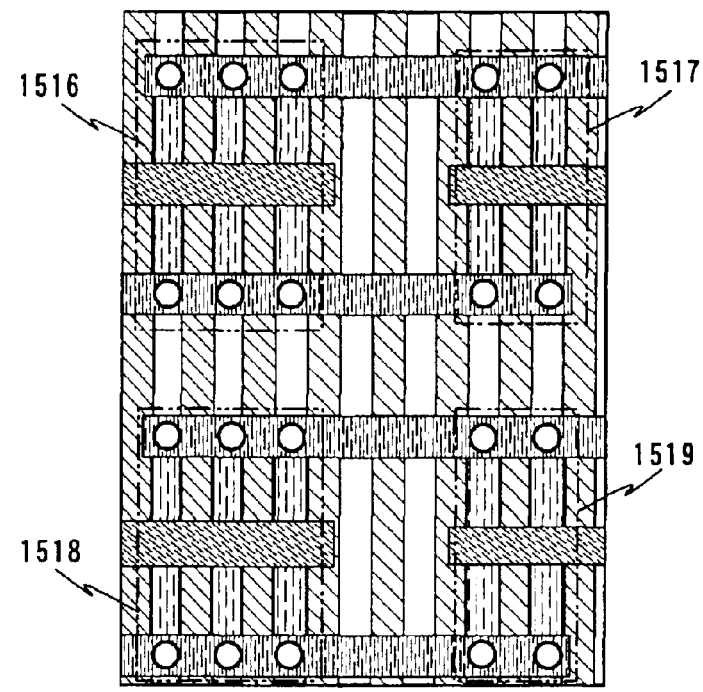
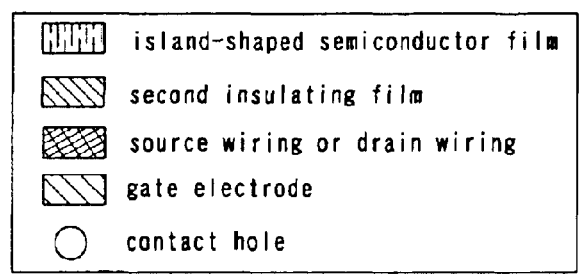

SEMICONDUCTOR CIRCUIT AND METHOD OF FABRICATING THE SAME

BACKGROUND OF THE INVENTION

1. Field of the Invention

The present invention relates to a semiconductor device which is formed by using a semiconductor film having a crystal structure (also referred to as a crystalline semiconductor film) and a method for manufacturing the same, as well as a semiconductor integrated circuit equipped with a circuit integrating the semiconductor devices and a method for manufacturing the same. Further, the present invention relates to a semiconductor device having a plurality of the semiconductor integrated circuits. And, the present invention especially relates to a thin film transistor which forms a channel forming region by a crystalline semiconductor film formed on an insulating surface as a semiconductor device.

2. Description of the Related Art

A technique for forming a semiconductor device such as a thin film transistor and the like using a crystalline semiconductor film formed on an insulation substrate such as glass, has been developed. The thin film transistor formed by using the crystalline semiconductor film is applied to a semiconductor integrated circuit, and the semiconductor integrated circuit is utilized to a flat panel display typified by a liquid crystal display device and an EL (electro luminescence) display device.

A current mirror circuit is a basic circuit of a semiconductor integrated circuit having the thin film transistor. The presupposition of the current mirror circuit is to have two thin film transistors with same electric characteristics. Such a circuit structure also can be given as an operational amplifier, a differential amplifier and the like.

As a method for forming a crystalline semiconductor film on an insulation substrate, a technique by using laser beams to crystallize an amorphous semiconductor film has been developed. In a semiconductor manufacturing process, such as the technique for crystallizing an amorphous semiconductor film by using laser beams, as light sources of the laser beams, a gas laser such as an excimer laser, and a solid laser such as a YAG laser are used generally. An example for crystallizing an amorphous semiconductor film by irradiating laser beams is disclosed in JP-A-62-104117, which proposes a poly-crystallization of the amorphous semiconductor film by high-speed scan with the scanning speed of laser beams set to more than a diameter of beam spot×5000/second, without making the amorphous semiconductor film result in a perfect melting state. In addition, U.S. Pat. No. 4,330,363 discloses a technique to form a substantially single crystal region by irradiating the extended laser beams on a semiconductor film, which is formed in the shape of an island. Or a method of irradiating a laser beam formed into a linear-like shape by an optical system, such as a laser processing apparatus disclosed in JP-A-8-195357 is known.

Further, JP-A-2001-144027 discloses a technique such that crystalline semiconductor films with large grain size are formed by irradiating laser beams of a second harmonic onto the amorphous semiconductor films using solid laser oscillation apparatus such as Nd: $YVO_4$ laser. A transistor is thus constituted.

However, when crystallization is made by irradiating the laser beams onto the amorphous semiconductor film, the crystal includes poly-crystals, producing defects such as a grain boundary which is formed at random. Therefore, it becomes difficult to obtain uniform crystallinity and crystal orientations. As a result, current values may vary even when semiconductor devices in same size are made and same voltages are applied to the semiconductor devices.

Crystal defects are involved in a grain boundary, resulting in a carrier trap. This may be considered as a causative factor that mobility of electrons or holes fall. Also, it is impossible to form a semiconductor film with neither distortion nor crystal defects due to a volume shrinkage of the semiconductor films, a thermal stress applied between the semiconductor film and a base film, or lattice mismatching, accompanied with crystallization. Consequently, the distortion and crystal defects produce causative factors of not only variation of electrical characteristics of the semiconductor device, but also inferior electrical characteristics of the semiconductor device.

Especially when crystalline semiconductor films are formed by using laser beams on a non-alkali glass substrate used abundantly and industrially, the focuses of the laser beams varies in response to the influence of the surge of the non-alkali glass substrate itself, involving a problem of causing crystalline variation as a result. Furthermore, in order for a non-alkali glass substrate to avoid contamination by the alkaline metal, it is necessary to prepare protection films such as insulating films, as base films. And it is almost impossible to form thereon the crystalline semiconductor films with no grain boundary and crystal defects, which are eliminated.

The semiconductor integrated circuit and the like have semiconductor films formed on cheap glass substrates to constitute transistors, therefore, it is almost impossible to arrange transistors so as to aovid grain boundaries formed at random. That is, the grain boundaris or crystal defects involved unexpectedly could not be eliminated by controlling strictly the crystallinity of the channel forming regions of transistors. This produced a causative factor of variation of electrical characteristics of the semiconductor device, thus, it is difficult to form a circuit which requires high conformity (for example, a current mirror circuit).

SUMMARY OF THE INVENTION

In view of the above-mentioned problems, an object of the present invention is to provide a forming method for a channel forming region from a crystalline semiconductor film with uniform crystallinity.

Another object of the present invention is to form a plurality of semiconductor devices which require high conformity from crystalline semiconductor films with uniform crystallinity, further to provide a semiconductor circuit in which variation between semiconductor devices is small and a semiconductor integrated circuit with high performance.

Still another object of the present invention is to provide a semiconductor circuit in which variation between a plurality of analog circuits is small (for example, analog switch circuits).

Further, especially, by designating a region where a channel forming region is formed to form a crystalline semiconductor region with no grain boundary existing therein, yet still further another object of the present invention is to provide a semiconductor integrated circuit which is constituted by a semiconductor device or a group of semiconductor devices which are capable of high speed operations and has high current driving capability.

In order to solve the problems, the invention is characterized in that, on a substrate having an insulating surface, formed is an insulating film with depressions and projections which are formed as linear stripe-shaped patterns, and an amorphous semiconductor film is formed on the insulating film, and the semiconductor film is melted and recrystallized at a portion which corresponds to the depression of the insulating film (hereinafter, simply referred to as the depression) so that a crystalline semiconductor film of stripe shape is obtained. It is characterized in that patterning is applied to the stripe-shaped crystalline semiconductor film on the same line to form an island-shaped semiconductor film including a channel forming region including the stripe-shaped crystalline semiconductor film.

And, the invention is characterized in that, in a part or whole of the thin film transistors configuring a current mirror circuit, a differential amplifier circuit, or an operational amplifier circuit wherein high conformance is required in its semiconductor devices, the channel forming region has the crystalline semiconductor film on the same line. Here, the high conformance means that the variation of the characteristics of the thin film transistors is reduced, i.e., that the conformance of characteristics of the thin film transistors is taken.

Also, the invention is characterized in that, among the thin film transistors configuring the analog circuit, at least the channel forming regions of the thin film transistors of the same polarity, or among the thin film transistors configuring the analog circuit, at least the channel forming regions of the thin film transistors sharing a gate electrode (i.e., the thin film transistors electrically connected to the same gate electrode) are formed on the same line. Also the invention is characterized in that, in an analog circuit to which a plurality of input signals are applied, the channel forming regions of the thin film transistors of the same polarity having the gate electrodes to which the input signals are applied are formed on the same line.

Also, the invention is characterized in that a plurality of analog circuits disposed adjacently are formed from the island-shaped semiconductor films formed by patterning the crystalline semiconductor film of the same line. That is, the invention is characterized in that, in an analog switch or a source follower as a specific analog circuit, the channel forming regions of the thin film transistors of the neighboring circuits are formed from the crystalline semiconductor films on the same line.

For example, in case that a plurality of analog switches comprising n-channel type thin film transistors and p-channel type thin film transistors are provided, the channel forming regions of the n-channel type thin film transistor configuring the analog switches are formed from the crystalline semiconductor films on the same line and the channel forming regions of the p-channel type thin film transistors are formed from the crystalline semiconductor films on the same line.

In this manner, the analog circuit of the invention having the crystalline semiconductor films on the same line as the channel forming regions of the thin film transistors are expected to have a high characteristic.

Also, as means for recrystallizing the semiconductor film of the invention, used is pulse oscillated or continuous wave laser light which light source is a gas laser oscillation apparatus or a solid laser oscillation apparatus. The laser light to be irradiated is one which is concentrated in a line shape by an optical system, and its intensity distribution may be such that a uniform area exists in a long direction and it is varied in a short direction. As the laser oscillation apparatus which is used as the light source, a rectangular beam solid laser oscillation apparatus is used, in particular more preferably, a slab laser oscillation apparatus is used. Or, it may be a solid laser oscillation apparatus using a rod in which Nd, Tm, Ho are doped, and in particular, may be one in which a solid laser oscillation apparatus using a crystal in which Nd, Tm, Ho are doped with a crystal such as YAG, $YVO_4$, YLF, $YAlO_3$ etc. is combined with a slab structure amplifier. As a slab material, a crystal such as Nd: YAG, Nd: GGG (gadolium, gallium, garnet), Nd: GsGG(gadolium, scandium, gallium, garnet), etc. is used. In the slab laser, light repeats total reflection and travels in a zigzag light path in this plate-shaped laser medium.

Also, strong light which is similar to the laser may be irradiated. For example, it may be light with high energy density in which concentrated is light which is emitted from a halogen lamp, a xenon lamp, a high-pressure mercury lamp, a metal halide lamp, an excimer lamp by a reflection mirror, a lens etc.

As the laser light or the strong light which is concentrated in a line shape and expanded in a long direction is irradiated to the semiconductor film, a position of laser light irradiation and a substrate on which the crystalline semiconductor films are formed move relatively, and the semiconductor films are melted by scanning a part or whole thereof by the laser light, and through that situation, crystallization or recrystallization is carried out. The scanning direction of the laser light is along a long direction of the depression formed in the insulating film and extending as a liner stripe pattern or a channel length direction of the transistor. By this, crystals are grown along the scanning direction of the laser light, and it is possible to prevent crystal grain boundaries from crossing the channel length direction.

The above-described depression may be formed by disposing silicon dioxide, silicon nitride, or silicon oxynitride film thickly and by etching it. It is desirable that the depression is formed in conformity to the arrangement of the island-shaped semiconductor film including the channel forming regions of the semiconductor devices, in particular, transistors, and formed in consistency with at least the channel forming regions. Also, it is desirable that the depression is disposed to be extended in the channel length direction, and formed with its width (channel width direction in case that the channel forming region is formed) of 0.01 $\mu$m and more, and 2 $\mu$m and less (optimally 0.1~1 m), and it is desirable that it is formed with its depth of 0.01 $\mu$m or more and 3 $\mu$m or less (optimally 0.1 $\mu$m or more, 2 $\mu$m or less).

Also, width of the channel forming region of the island-shaped crystalline semiconductor film by patterning so as to have a plurality of the stripe-shaped crystalline semiconductor, films is considered to be sum of widths of the plurality of the striped-shaped crystalline semiconductor films.

By setting depth of the depression as the same level or more as thickness of the semiconductor film, the semiconductor film which is melted by irradiation of the laser light or the strong light is coagulated and solidified in the depression due to surface tension. As a result, the thickness of the semiconductor film located on the projection of the insulating film gets thinner so that it is possible to localize stress-strains on it. Also, a side surface of the depression has an effect for defining crystal orientation to some degree.

In the insulating film on which the depressions and the projections of the invention are disposed, it is described that an angle formed by the side surface and the bottom surface of the depression (the side surface of the depression and the substrate) becomes a right angle but, there is a case that it is deviated from the right angle according to forming conditions. However, as described above, since the side surface of the depression has the effect for defining the crystal orientation to some degree, adversely, there is no problem even if it is formed by controlling the angle formed by the side surface of the depression and the substrate so that it has a taper, utilizing the deviation.

As described above, the semiconductor film is made to be in a melted situation by use of means such as the laser etc., and coagulated in the depression formed on the insulating surface by the surface tension, and crystals are grown from the side surface portion of the depression so that the strains generated based upon the crystallization can be localized to an area other than the depression. That is, it is possible to liberate the crystalline semiconductor area(first crystalline semiconductor area) formed to be filled in the depression from the strains. Also, among the insulating films in which portions corresponding to the depressions or the projections are disposed, on the portion corresponding to the projection (hereinafter, simply referred to as the projection), the crystalline semiconductor area including crystal grain boundaries or crystal defects (second crystalline semiconductor area) is to be formed.

That is, since crystallinity of the crystalline semiconductor film formed on the projection is inferior as compared to the crystalline semiconductor film formed in the depression, it is desirable to avoid utilizing it as the channel forming region. However, the crystalline semiconductor film formed on the projection may be used positively as an electrode (in case of the thin film transistor, corresponds to a source electrode or a drain electrode) or wiring. In case that it is used as the wiring, since degree of freedom of design as to an area to be occupied is high, it is possible to use as a resistance by adjusting the length of the wiring, or to give a function as a protection circuit by having its shape bent.

Also, as the semiconductor film which is formed on the insulating film and around an area of the depression, used is an amorphous semiconductor film, a polycrystalline semiconductor film (including one which is formed by film formation and one which is formed by a solid phase growth) or a microcrystalline semiconductor film which is formed by a well-known method. Typically, the amorphous silicon film is used, and besides that, an amorphous silicon germanium film, an amorphous silicon carbide film etc. can be used. In addition, it is desirable that, in silicon germanium, a composition ratio of Ge to Si is 0.01–2 atom %.

And, a gate insulating film contacting the island-shaped semiconductor film is formed, and further, a gate electrode is formed. On the occasion of this patterning, it is desirable that a taper is disposed at an end portion of the island-shaped semiconductor film. After this, a field effect transistor can be formed by use of a well known technique.

According to the invention, on the insulating surface, in particular, on the insulating surface in case that an inexpensive glass substrate is used as a support substrate, the channel forming regions are formed from the stripe-shaped crystalline semiconductor films on the same line so that variation between a plurality of semiconductor devices can be reduced, and further, variation between semiconductor circuits (analog circuits) can be reduced, and it is possible to provide a high-performance semiconductor integrated circuit. In addition, two or more semiconductor circuits gather to form the semiconductor integrated circuit, and the semiconductor circuit has semiconductor devices comprising thin film transistors in which at least conformity is required.

Also, since, by designating an area in which the channel forming regions of the thin film transistors are formed, it becomes possible to form a crystalline semiconductor area in which crystal grain boundaries do not exist in the area, it is possible to provide a semiconductor integrated circuit which is configured by a semiconductor device or a group of semiconductor devices, which are capable of high speed operations and in which current drive capability is high. Further, it is possible to provide a liquid crystal display apparatus having the semiconductor circuit of the invention, and a flat type display apparatus as represented by an EL (electroluminescence) apparatus.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The invention, together with further advantages thereof, may best be understood by reference to the following description taken in conjunction with the accompanying drawings in which:

FIGS. 7A, 7B, 7C, 7D, and 7E are sectional views explaining detail of relation of a shape of a opening part in crystallization and a conformation of a crystalline semiconductor film;

FIGS. 13A, 13B, 13C, and 13D are views showing a status of laser light which is used in the embodiment of the invention;

FIGS. 14A-1, 14A-2, 14B-1, and 14B-2 are circuit diagrams and top views explaining examples in which the transistor of the invention is applied to a circuit;

FIGS. 15A and 15B are a circuit diagram and a top view explaining an example in which the transistor of the invention is applied to a circuit;

DESCRIPTION OF THE EMBODIMENTS

Embodiment 1

In this embodiment, a manner for fabricating a thin film transistor by carrying out the invention will be described. Also, in FIGS. 3 to 6, it is described that there are two thin film transistors on the same stripe but, the number of the thin film transistors to be formed may be determined appropriately by a person who carries out it, and any of the figures used does not give any limitations to the invention.

Figure 1A:
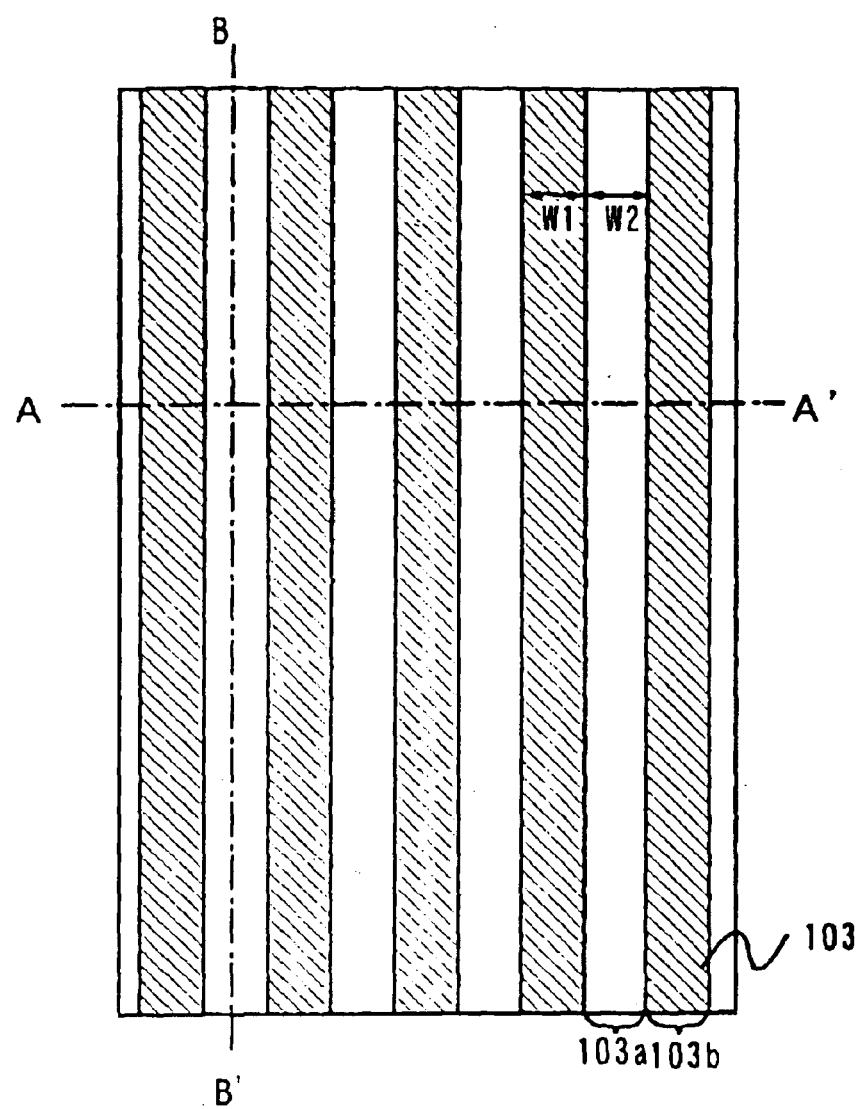
FIGS. 1A, 1B, and 1C are a top view and sectional views explaining a method of fabricating a transistor of the invention.
Figure 1B:
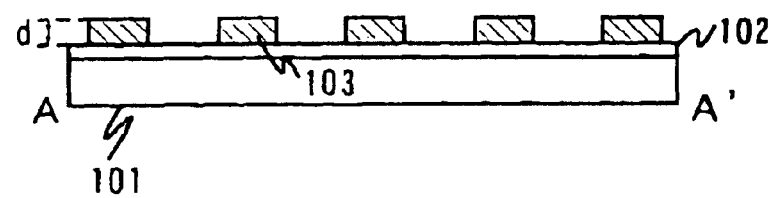
Figure 1C:
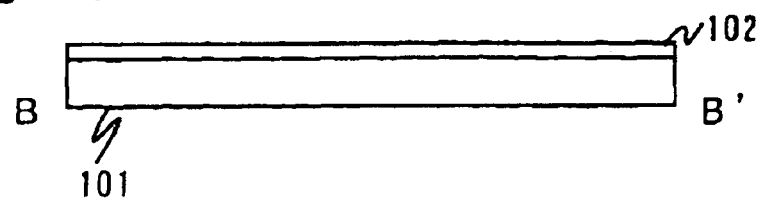

Firstly, FIGS. 1A to 1C will be described. FIG. 1A is a top view, and FIG. 1B is a sectional view corresponding to A-A'. It shows a situation that, on a substrate 101, a first insulating film 102 and a second insulation firm 103 which is formed in a linear stripe pattern are formed. In addition, in the embodiment, a depression designates a portion shown by 103a, and a projection designates a portion shown by 103b.

As the substrate 101, a commercially available non-alkali glass substrate, a quartz substrate, a sapphire substrate, a substrate which is formed by coating a surface of a monocrystalline or polycrystalline semiconductor substrate with an insulating film, and a substrate which is formed by coating a surface of a metal substrate with an insulating film can be used.

In order to form the linear stripe pattern with sub-micron design rule, it is desirable that concavity and convexity of a surface of a substrate, a vertical interval of a surface of a substrate caused by surge or twist of the substrate is set to be less than focal depth of an photolithography apparatus (in particular, a stepper). To be more precise, it is desirable that the vertical interval of the surface of the substrate caused by surge or twist of the substrate is 1 $\mu$m or less in one time light exposure irradiation area, preferably 0.5 $\mu$m and less. As to this point, particularly, in case that the non-alkali glass is used as the support substrate, attentions are needed.

It is desirable that width (W1) of the second insulating film 103 which is formed in the linear stripe pattern is of 0.1–10 $\mu$m (preferably 0.5–1 $\mu$m), and an interval (W2) between it and the adjacent second insulating film is of 0.01–2 $\mu$m (preferably 0.1–1 $\mu$m), and thickness (d) of the second insulating film is of 0.01–3 $\mu$m (preferably 0.1–2 $\mu$m). Also, there is no necessity that a shape of a step is in a regular cycle pattern, and it may be arranged with a different interval in conformity to width of an island-shaped semiconductor film. There is particularly no numerical limitation as to its length, and it is possible to form with a length as to cross from one end of the substrate to other end as shown in FIG. 1, and it is possible to have length with such a degree that a channel forming region of a transistor can be formed as described later in Embodiment 2.

The first insulating film 102 may be formed by a material which can secure a selection ratio on etching between it and a second insulating film which will be formed later, and formed typically by a material selected from a group of silicon nitride, silicon oxide, silicon oxynitride (indicated as SiOxNy), silicon nitride-oxide (indicated as SiNxOy), aluminum nitride (indicated as AlxNy), aluminum oxynitride (indicated as AlOxNy), aluminum nitride-oxide (indicated as AlNxOy), and aluminum oxide with thickness of 30–300 nm. In particular, since an aluminum oxide film can be expected to have a blocking effect to sodium (Na), it is useful as a measure for preventing the glass substrate from being polluted.

In addition, as a silicon oxynitride (SiOxNy) film, may be used one which includes Si of 25–35 atom %, oxygen of 55–65 atom %, nitrogen of 1–20 atom %, and hydrogen of 0.1–10 atom %. Also, as a silicon nitride-oxide (SiNxOy) film, may be used one which includes Si of 25–35 atom %, oxygen of 15–30 atom %, nitrogen of 20–35 atom %, and hydrogen of 15–25 atom %. Also, as an aluminum oxynitride (AlOxNy) film, may be used one which includes Al of 30–40 atom %, oxygen of 50–70 atom %, and nitrogen of 1–20 atom %. Also, as an aluminum nitride-oxide (AlNxOy) film, may be used one which includes Al of 30–50 atom %, oxygen of 0.01–20 atom %, and nitrogen of 30–50 atom %.

The second insulating film 103 may be formed by silicon oxide or silicon oxynitride with thickness of 10–3000 nm, preferably, 100–2000 nm. The silicon oxide can be formed by plasma CVD using mixed tetraethyl ortho silicate (TEOS) and $O_2$. The silicon nitride-oxide film can be formed by plasma CVD using $SiH_4$, $NH_3$, $N_2O$ or $SiH_4$, $N_2O$ as raw materials.

In addition, the second insulating film 103 is desirable to use the insulating film which is formed by CVD (typically, plasma CVD or thermal CVD) or PVD (typically, spattering method or deposition method). This is because, on the occasion of crystallizing the amorphous semiconductor film, keeping such softness that stress based upon the crystallization can be relaxed is considered to act as an important role for obtaining good crystallinity.

As shown in FIG. 1, in case that the linear stripe pattern is formed by two-ply insulating films, it is necessary to set a selection ratio between the first insulating film 102 and the second insulating film 103 in an etching process. In a practical sense, it is desirable to adjust appropriately materials and film forming conditions such that etching speed of the second insulating film 103 becomes relatively faster than that of the first insulating film 102. As an etching method, a mask is disposed in areas which will become the projections of the second insulating film, and it is carried out by using an etching by use of buffering hydrofluoric acid, or a dry etching by use of $CHF_3$.

It is desirable that film thickness of the channel forming region of the semiconductor film is set to be thickness with the same degree or less as depth (corresponds to a step d of FIG. 1B) of the depression which is formed in the second insulating film 103.

Also, next, a relation of the step d of the second insulating film 103 and film thickness of the semiconductor film in the depression 103a will be described.

FIG. 7 shows information of crystallization which is obtained from a result of an experiment conducted by the inventor as conceptual views. FIGS. 7A to 7E shows the first insulating film 102 and a relation of depth of the depression 103a of the second insulating film, the interval, the step d and crystal growth in a patterned manner.

In addition, with regard to sings relating to length shown in FIG. 7, it is assumed to be, a1: thickness of an amorphous semiconductor film 710 on the second insulating film (on the projection), a2: thickness of the amorphous semiconductor film 710 in the depression, p1: thickness of a crystalline semiconductor film 711 on the second insulating film (on the projection), p2: thickness of the crystalline semiconductor film 711 in the depression, d: thickness of the second insulating film (depth of the depression, i.e., the step), W1: width of the second insulating film (width of the projection), W2: width of the depression (interval of neighboring projections). In addition, FIG. 7, like FIG. 1, shows the first insulating film 102 and the second insulating film 103.

FIG. 7A is a case that d<a2, and W1 and W2 are the same level as or less than 1 µm, and i.e., in case that depth of the depression is smaller than thickness of the amorphous semiconductor film 710 in the depression, there is no case that a surface of the crystalline semiconductor film 711 is sufficiently flattened, even through processes of melting and crystallization. That is, a surface situation of the crystalline semiconductor film 711 becomes a situation to which a shape of depression and projection of a base film (in particular, the second insulating film) is reflected.

FIG. 7B is a case that d≧a2, and W1 and W2 are the same level as or less than 1 µm, and i.e., in case that depth of the depression is larger than thickness of the amorphous semiconductor film 710 in the depression, surface tension operates and the semiconductor film gathers in the depression. In such a situation that as it gathers, it is solidified, as shown in FIG. 7B, a surface is substantially flattened. In this case, P1<P2, and stress is concentrated on a portion 720 where film thickness of the semiconductor film on the second insulating film 103 and strains are concentrated there, and a crystal grain boundary is to be formed at 720.

FIG. 7C is a case that d>a2, and W1 and W2 are the same level as or less than 1 µm, and the crystalline semiconductor film 711 is formed to fill the depressions, and it is also possible that the semiconductor film does not almost remain on the second insulating film 103.

FIG. 7D is a case that d≧a2, and W1 and W2 are the same level as or more than 1 µm, and as the width (W2) of the depression is broadened, the depression is filled with the crystalline semiconductor film 711 so that there-is an effect of planarization but, the crystal grain boundary is likely to occur in the vicinity 721 of a center of the depression. Also, on the second insulating film, stress is concentrated in the similar way and strains are stored at 720 so that the crystal grain boundary is formed. It is estimated that this is because the effect of relaxing stress is reduced in case that the interval is broadened.

FIG. 7E is a case that d≧a2, and W1 and W2 are the same level as or more than 1 µm, and the situation of FIG. 7D becomes further obvious.

As described above by use of FIG. 7, in case that the semiconductor device is formed, in particular, in case that the channel, forming region of the transistor is formed, it is considered that the manner in FIG. 7B is optimum. Also, here, as the shape of the depression and the projection of the base which forms the crystalline semiconductor film, shown is one example in which it is formed by the first insulating film and the second insulating film but, it is not limited to the manner shown here and if there is one having a similar shape, it can be substituted. For example, the shape of depression and projection may be disposed by applying etching processing to a surface of a quartz substrate to directly form the depressions.

Figure 2A:
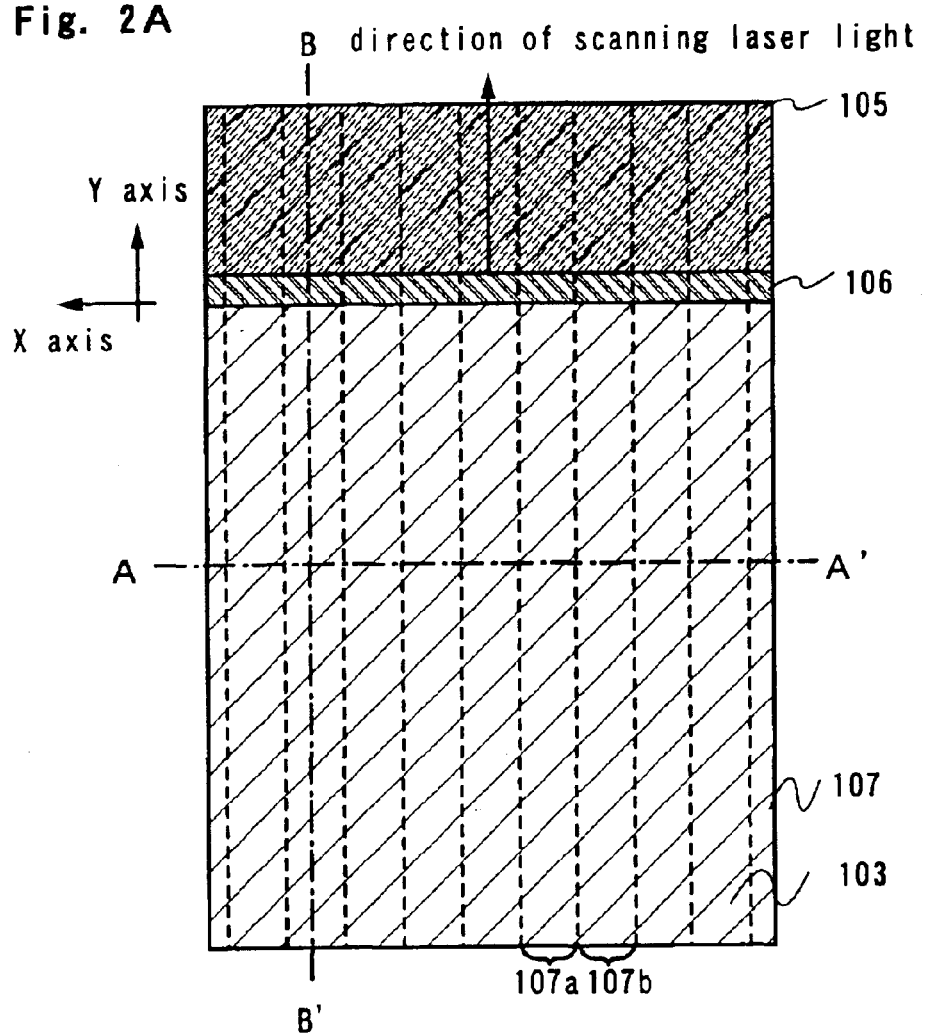
FIGS. 2A, 2B, and 2C are a top view and sectional views explaining the method of fabricating the transistor of the invention.
Figure 2B:
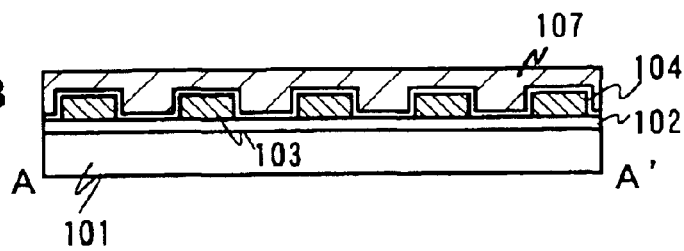
Figure 2C:
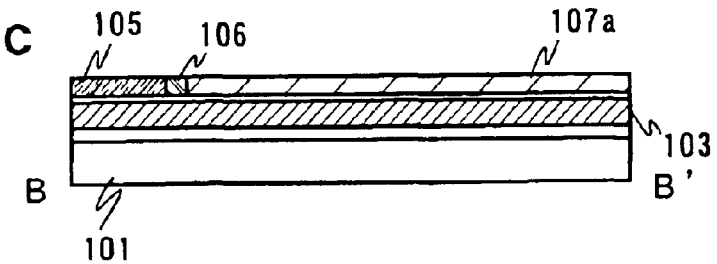

Next, laser irradiation will be described by use of FIG. 2. FIG. 2A is a top view, and FIG. 2B is a sectional view corresponding to A–A', and FIG. 2C is a sectional view corresponding to B–B'. They shows such an appearance that an amorphous semiconductor film 105 is formed to cover the second insulating film 103 and crystallization is carried out by continuous wave line-shaped laser light.

Firstly, an insulating film 104 which functions as a buffer (hereinafter, referred to as a buffer film) is formed so as to cover surfaces comprising the first insulating film 102 and the second insulating film 103 and depressions 103a, and thereafter, the amorphous semiconductor film 105 is continuously formed to be of thickness of 0.01–3 µm (preferably, 0.1–1 µm) without releasing atmosphere. The buffer film 104 is to aim elimination of influence of chemical pollution such as boron which is attached to the surfaces of the first insulating film 102 and the second insulating film 103 and improvement of adhesion, and there is a sufficient effect even in case of a thin one. Typically, it may be set to be 5–50 nm (preferably 20 nm or more in order to improve blocking effect of the chemical pollution).

And, the amorphous semiconductor film 105 is melted instantaneously and crystallized. This crystallization is carried out by irradiating laser light which is concentrated to such degree of energy density that the semiconductor film is melted by an optical system or emitted light from a lamp light source. In this process, in particular, it is desirable to use laser light which is generated from a continuous wave laser oscillation apparatus as a light source. The laser light used is one which is concentrated in a line shape by the optical system and expanded in a major axis direction, and it is desirable that its strength distribution have a uniform area in the major axis direction. Also, there is no problem that it has some degree of distribution in a minor axis direction.

For example, as one example of a condition of crystallization, $YVO_4$ laser oscillator of continuous oscillation mode is used, and an output, 5–10 W of its second harmonic (wavelength: 532 nm) is concentrated to be line-shaped laser light in which a ratio of a long direction to a short direction is 10 or more, and concentrated so as to have uniform energy density distribution in the long direction, and crystallized by scanning with speed of 5–200 cm/sec. In addition, the uniform energy density distribution is not one which excludes everything other than completely constant one, and a scope which is allowed in the energy density distribution is within a scope of ±10%.

Also, the crystallization by the laser light which is concentrated in a line shape may be completed by only one time scanning (i.e., one direction), or by reciprocating scanning in order to further improve the crystallinity. According to need, the laser light which is concentrated in the line shape may be scanned in a zigzag manner. Further, after the crystallization is carried out by the laser light, oxide may be removed by hydrofluoric acid etc., or a surface of a silicon film may be processed by alkaline solution such as ammonia hydrogen peroxide aqueous solution, and a portion with fast etching speed and bad quality may be selectively removed, and similar crystallization processing (re-crystallization) may be carried out again.

As the laser oscillation apparatus, a rectangular beam solid laser oscillation apparatus is used and, in particular, preferably, a slab laser oscillation apparatus is used. As a slab material, a crystal such as Nd: YAG, Nd: GGG (gadolium, gallium, garnet), Nd: GsGG(gadolium, scandium, gallium, garnet), etc. is used. In the slab laser, light repeats total reflection and travels in a zigzag light path in this plate-shaped laser medium. Or, it may be a solid laser oscillation apparatus using a rod in which Nd, Tm, Ho are doped, and in particular, may be one in which a solid laser oscillation apparatus using a crystal in which Nd, Tm, Ho are doped with a crystal such as YAG, $YVO_4$, YLF, $YAlO_3$ etc. is combined with a slab structure amplifier.

And, as shown in FIG. 2A by an arrow, the line-shaped laser light or strong light is scanned so as to cross a long direction of length of an irradiation area 106 of the line-shaped laser light (in the figure, X axis direction) with each of the second insulating films 103 which become the linear stripe patterns. In addition, here, the "line shaped" means one in which a ratio of length in the major axis direction (in the figure, X axis direction) to length in the minor axis direction (in the figure, Y axis direction) is 1:10 and more. Also, although only a part thereof is shown in FIG. 2, an end part of the irradiation area 106 of the line-shaped laser light may be a rectangular shape or a shape having curvature.

Also, it is desirable that wavelength of the continuously wave laser light is 400–700 nm taking light absorption coefficient of the amorphous semiconductor film into consideration. Light having such wavelength area is obtained by picking up a second harmonic and a third harmonic of a fundamental wave by use of a wavelength conversion device. As the wavelength conversion device, ADP (ammonium dihydrogen phosphate), $Ba_2NaNb_5O_{15}$ (barium natrium niobate), CdSe(cadmium celenide), KDP (kalium dihydrogen phosphate), $LiNbO_3$ (litium niobate), Se, Te, LBO, BBO, KB5 etc. are used. In particular, it is desirable to use LBO. In one typical example, a second harmonic (532 nm) of Nd: $YVO_4$ laser oscillation apparatus (fundamental wave 1064 nm) is used. Also, as an oscillation mode of the laser, a single mode which is $TEM_{00}$ mode is used.

In case of silicon which is selected as an appropriate material, an area where an absorption coefficient is of $10^3$–$10^4$ cm$^{-1}$ falls within a visible light area. In case that a substrate such as glass having high visible light transmittance and an amorphous semiconductor film including silicon with thickness of 30–200 nm are crystallized, by irradiating light in the visible light area of wavelength 400–700 nm, the semiconductor film is selectively heated, and the crystallization can be carried out without giving any damages to a base insulating film. To be more precise, length of invasion of light of wavelength 532 nm is roughly 100 nm–1000 nm to the amorphous silicon film, and it is possible to sufficiently reach inside of the amorphous semiconductor film 105 which is formed with thickness 30 nm–200 nm. That is, it is possible to heat the semiconductor film from its inside, and it is possible to uniformly heat almost entire semiconductor film in the irradiation area of the laser light.

The laser light is scanned in a direction which is parallel to an extending direction of the linear stripe patterns, and dissolved semiconductor is poured into the depressions due to its surface tension and solidified. In the solidified situation, as shown in FIG. 2B, the surface is substantially flattened. This is because, once the semiconductor is melted, whether it is on the projections or on the depressions, a phase boundary of the melted semiconductor and a vapor phase reach to an equilibrium situation and a flat phase boundary is formed. Further, a crystal growth end and a crystal grain boundary are formed on the second insulating film (on the projection). By this means, the crystalline semiconductor film 107 is formed. In addition, 107a designates a semiconductor area which is formed in the depression and has high crystallinity (first crystalline semiconductor area), and 107b designates a crystalline semiconductor area (second crystalline semiconductor area) which is formed on the projection and has inferior crystallinity.

In addition, on the occasion of the above-described crystallization process, if the second insulating film is a soft insulating film (insulating film with low density), such an effect that stress due to shrinkage etc. of the semiconductor film at the time of crystallization is relaxed can be expected. Adversely, if it is a hard insulating film (insulating film with high density), since stress occurs in the manner being adverse to the semiconductor film which is intended to shrink or expand, stress-strain etc. are apt to remain in the semiconductor film after crystallization which may become a cause of crystal defects. For example, in a well known graphoepitaxy technology ("M. W. Geis, D. C. Flanders, H. I. Smith: Appl. Phys. Lett. 35(1979)pp71"), depressions and projections are directly formed on a hard quartz substrate and in this case, it is impossible to relax thermal shrinkage and stress occurrence based upon the crystallization, and there can occurs defects caused by strain or dislocation due to stress.

However, the Applicant does take those points into consideration, and on the occasion that the depressions and the projections are formed on an inexpensive glass substrate, used is a soft insulating film which is formed by CVD or PVD and a softer material than quartz glass is used for the second insulating film which becomes the base film, thereby aiming relaxation of stress occurrence on the occasion of the crystallization, and on that point, this invention and the above-described well known graphoepitaxy technique differ essentially.

In addition, meaning of the insulating film which is softer than quartz glass means, for example, an insulating film which etching rate is faster than that of quartz glass (quartz glass which is industrially utilized as a substrate) under the same measurement condition, or an insulating film which hardness is lower under the same measurement condition. In addition, with regard to the etching rate and the hardness, since they may be absolutely relative comparison to the quartz glass, absolute value of the etching rate is not a issue and they do not depend upon the measurement condition of the etching rate and the measurement condition of the hardness.

For example, if the silicon oxynitride film is used as the second insulating film, desirable is a silicon oxynitride film which is formed by plasma CVD using $SiH_4$ gas and $N_2O$ gas as source materials. The silicon oxynitride film has the etching rate of 110–130 nm/min (after thermal treatments of 500° C., 1 hour+550° C., 4 hours, 90–100 nm/min) in mixed aqueous solution at 20° C. including ammonium hydrogen fluoride ($NH_4HF_2$) of 7.13% and ammonium fluoride ($NH_4F$) of 15.4%.

Also, if a silicon nitride-oxide film is used as the second insulating film, desirable is a silicon nitride-oxide film which is formed by plasma CVD using $SiH_4$ gas, $NH_3$ gas, and $N_2O$ gas as source materials. The silicon nitride-oxide film has the etching rate of 60–70 nm/min (after thermal treatments of 500° C., 1 hour+550° C., 4 hours, 40–50 nm/min) in mixed aqueous solution at 20° C. including ammonium hydrogen fluoride ($NH_4HF_2$) of 7.13% and ammonium fluoride ($NH_4F$) of 15.4%.

As described above, the linear stripe patterns having the depressions and the projections by the insulating films are formed, and the amorphous semiconductor film is deposited on it, and by crystallizing it through the melting condition by irradiation of the laser light, the semiconductor film is poured into the depressions and are solidified, and it is possible to concentrate strain or stress based upon the crystallization to areas other than the depressions, and it becomes possible to selectively form an area with bad crystallinity having such as the crystal grain boundary. And, the feature of the invention is that a semiconductor area with good crystallinity is used as an area where career transfer is carried out, such as the channel forming region etc. of the thin film transistor.

After that, it is good that heat treatment of preferably, 500–600° C. is carried out and the strain stored in the crystalline semiconductor film is removed. This strain is one which is generated by volume shrinkage of semiconductor which occurs due to the crystallization, thermal stress and lattice misfit with the base, and so on. This heat treatment may be carried out by use of a normal thermal treatment apparatus, and for example, treatment of 1–10 minutes may be carried out by use of a rapid thermal annealing (RTA) method of a gas heating system. In addition, this process is not an essential requirement in this invention, and may be properly selectively carried out.

Figure 3A:
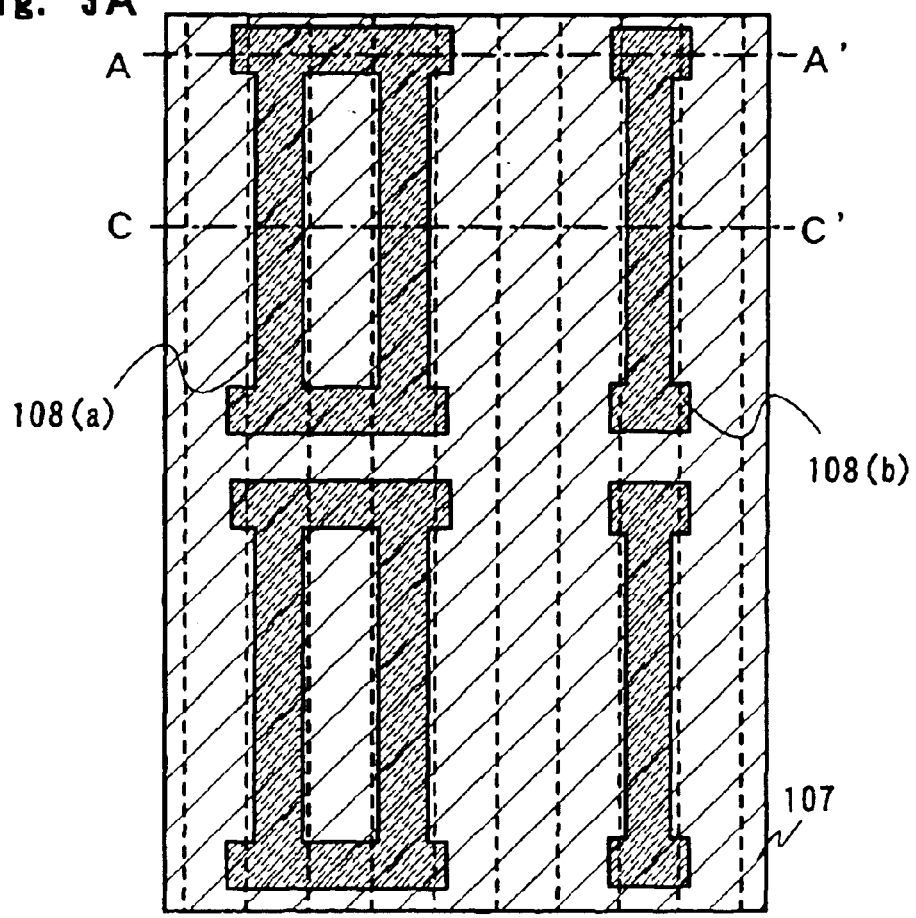
FIGS. 3A, 3B, and 3C are a top view and sectional views explaining the method of fabricating the transistor of the invention.
Figure 3B:
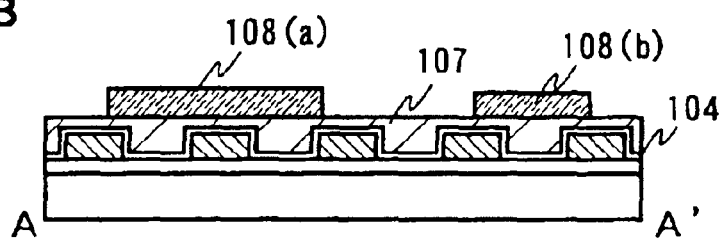
Figure 3C:
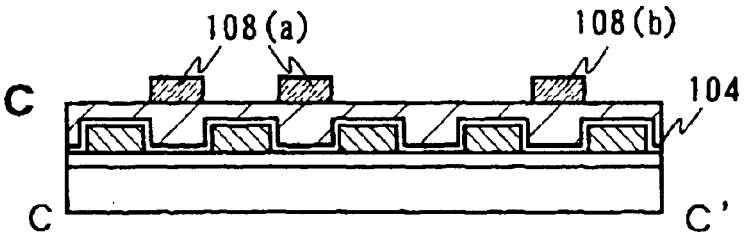

Next, FIG. 3 will be described. FIG. 3A is a top view, and FIG. 3B is a sectional view corresponding to A–A', and FIG. 3C is a sectional view corresponding to C–C'. They shows a situation that patterning is applied on the crystalline semiconductor film 107 to clearly define an island-shaped semiconductor film of the thin film transistor.

In FIG. 3A, resist masks 108(a) and 108(b) are disposed covering the depressions and the projections of the second insulating film 103. This is because even if it is the crystalline semiconductor film which is formed on the projection of the second insulating film 103 and has inferior crystallinity, as long as it is utilized as an electrode but not as the channel forming region, there occurs no problem. That is, by actively using it as an area such as a source region and a drain region of the thin film transistor, it is possible to secure a design margin of a contact part with an electrode which is connected to each region of the source region and the drain region (a source electrode or a drain electrode). Also, a shape of a resist mask may be designed properly, and this embodiment shows an example of 108(a) and 108(b).

Also, taking deviation of the resist masks into consideration, after first resist masks are disposed on a source region and a drain region, the surface of the crystalline semiconductor film 107 may be etched out, and the island-shaped semiconductor film may be formed by use of a second resist mask as shown in FIG. 3. This will be described in an embodiment 3.

Figure 4A:
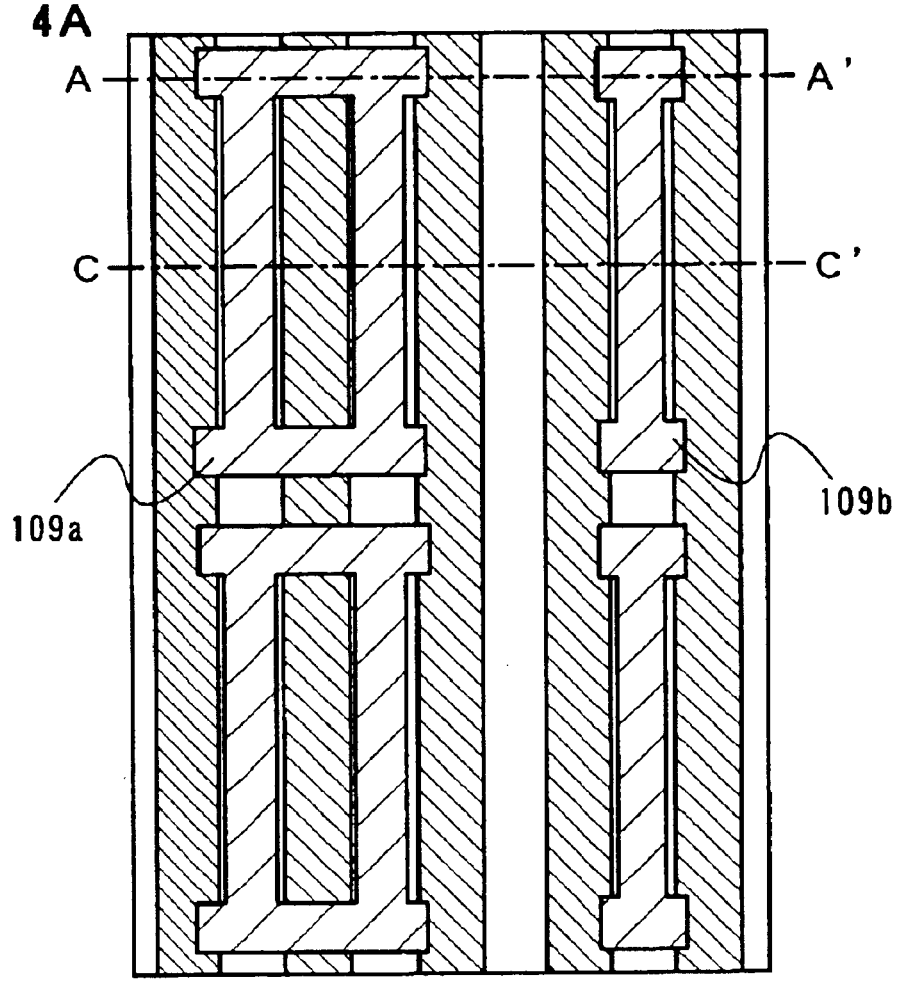
FIGS. 4A, 4B, and 4C are a top view and sectional views explaining the method of fabricating the transistor of the invention.
Figure 4B:
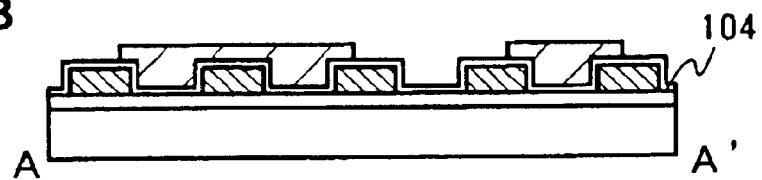
Figure 4C:
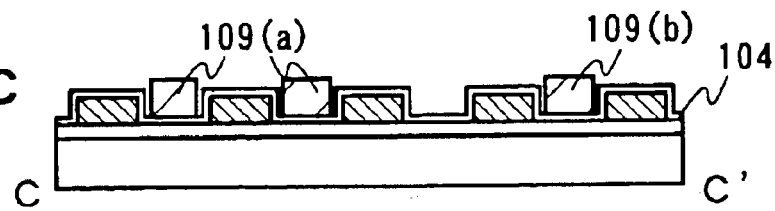

Next, FIG. 4 will be described. FIG. 4A is a top view, and FIG. 4B is a sectional view corresponding to A–A', and FIG. 4C is a sectional view corresponding to C–C'. They show such a situation that, after the crystalline semiconductor film 107 is patterned, dry etching or wet etching is carried out so that island-shaped semiconductor films (also called as an active layer) 109(a) and 109(b) of the thin film transistors are formed.

The crystalline semiconductor film 107 can be etched having selectivity with the buffer film 104 by use of fluorinated gas and oxygen as etching gas. Of course, even when the buffer film 104 is etched, if only selectivity with the first insulating film 102 beneath it can be assured, there occurs no problem. In addition, the etching may be carried out by use of plasma etching using mixture gas of $CF_4$ and $O_2$, and $NF_3$ gas as etching gas, and plasma-less gas etching may be carried out using halogen fluoride gas such as $ClF_3$ gas etc. without excitation. Since the plasma-less gas etching does not give plasma damages to the crystalline semiconductor film, it is a more effective technique for suppressing crystal defects.

Also, on the occasion of forming the island-shaped semiconductor films 109(a) and 109(b), it is desirable to dispose taper at an end part (edge) of the island semiconductor film. A taper angle may be 20–85° (preferably 45–60°). By this, coverage (covering ratio) of a gate insulating film which will be formed later can be improved, and it is possible to prevent disconnection and short-circuit of the gate electrode, and so on.

In the crystalline semiconductor film which is obtained by carrying out the invention, there is no crystal grain boundary or defects which takes shape by secco etching, which in other words, substantially does not exist. In addition, the secco etching means an etching technique using generally known secco solution (chemical in which $HF:H_2O=2:1$ is blended with $K_2Cr_2O_7$ as an additive) in order to elicit the crystal grain boundary on the surface of the crystalline semiconductor film. In this specification, the secco solution means one in which potassium dichromate ($K_2CrO_7$) of 2.2 g is melted in water of 50 cc to prepare solution of 0.15 mol/l and hydrofluoric acid of 100 cc is added to the solution and then, the solution is further 5 times diluted with water, and the secco etching means applying etching treatment of 75 seconds by use of the above-described secco solution at room temperature (10–30° C.).

The crystal grain boundary which is elicited by the secco etching has not been identified yet at present stage but, a well known fact is that deposited defects and crystal grain boundaries are preferentially etched by the secco etching. Of course, since it is not a single crystal, there may be grain boundaries and defects which are not elicited as a matter of course but, since such grain boundaries and defects are not ones which give influences to electrical characteristics on the occasion of fabricating semiconductor devices, it is considered that they are electrically inactive. Normally, the electrically inactive grain boundary is one which is called as a plane-shaped grain boundary (low or high degree twin crystal or coincidence grain boundary), and the grain boundary which is not elicited by the secco etching is assumed to be the plane-shaped grain boundary. From that view point, it is permissible to say that substantially no existence of the crystal grain boundaries or defects is no existence of the crystal grain boundaries other than the plane-shaped grain boundaries.

Figure 5A:
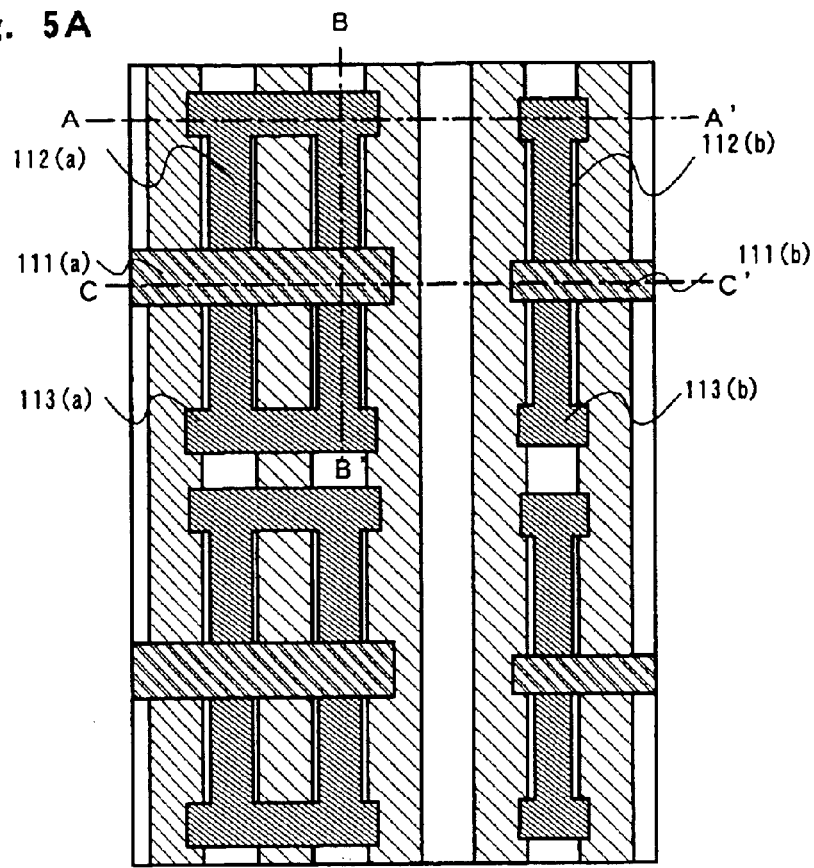
FIGS. 5A, 5B, 5C, and 5D are a top view and sectional views explaining the method of fabricating the transistor of the invention.
Figure 5B:
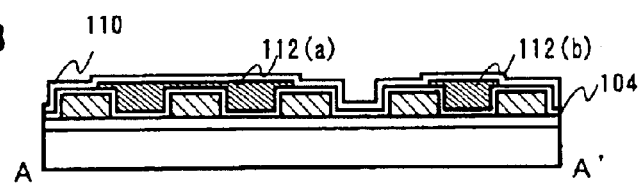
Figure 5C:
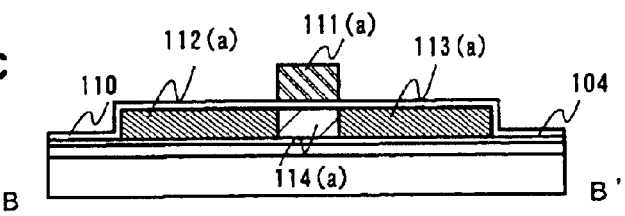
Figure 5D:
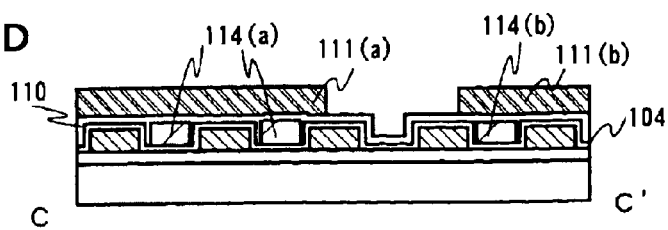

Next, FIG. 5 will be described. FIG. 5A is a top view, and FIG. 5B is a sectional view corresponding to A–A', and FIG. 5C is a sectional view corresponding to B–B', and FIG. 5D is a sectional view corresponding to C–C'. They shows such a situation that, after the island-shaped semiconductor films 109(a) and 109(b) are formed, a gate insulating film 110 and gate electrodes 111(a) and 111(b) are formed.

As the gate insulating film 110, any one of the above-described silicon oxide film, a silicon nitride film, a silicon oxynitride film, a silicon nitride-oxide film, an aluminum nitride film, an aluminum nitride-oxide film, an aluminum oxynitride film, and an aluminum oxide film may be used, and a laminated film formed by properly combining them may be used. In order to improve coverage of the gate insulating film, in case of the silicon oxide film, the silicon oxide film using TEOS is desired, and in case of the aluminum nitride-oxide film, it is good to use the aluminum nitride-oxide film which is formed by RF spattering method and a laminated film of the aluminum nitride-oxide film and the silicon oxide film (the silicon oxide film may be one in which a semiconductor film as an active layer is oxidized by hydrogen peroxide).

Also, the gate electrode 111 may be formed by tungsten or alloy including tungsten, tantalum or alloy including tantalum, or, aluminum or aluminum alloy etc.

Next, shown is such a situation that source regions 112(a) and 112(b) and drain regions 113(a) and 113(b) are formed in a self-aligning manner by use of the gate electrodes 111(a) and 111(b) as masks. Also, by this process, channel forming regions 114(a) and 114(b) are clearly defined.

In this embodiment, in order to obtain p-type to the source regions 112(a) and 112(b) and drain regions 113(a) and 113(b), an element which belongs to 13 family of a periodic table (typically, boron is used) is added but, in order to obtain n-type, an element which belongs to 15 family of the periodic table (typically, phosphorous or arsenic is used) may be added. An adding method may be a well known technique. Also, according to need, a drain region with low density (generally called as LDD region) may be disposed.

Also, after the source regions 112(a) and 112(b) and drain regions 113(a) and 113(b) are formed, activation of the source regions 112(a) and 112(b) and drain regions 113(a) and 113(b) is carried out by use of furnace annealing, laser annealing, or RTA(rapid thermal annealing). In addition, RTA may be annealing by use of infrared ray or ultraviolet ray using a lamp light source, and may be annealing by heated gas.

Figure 6A:
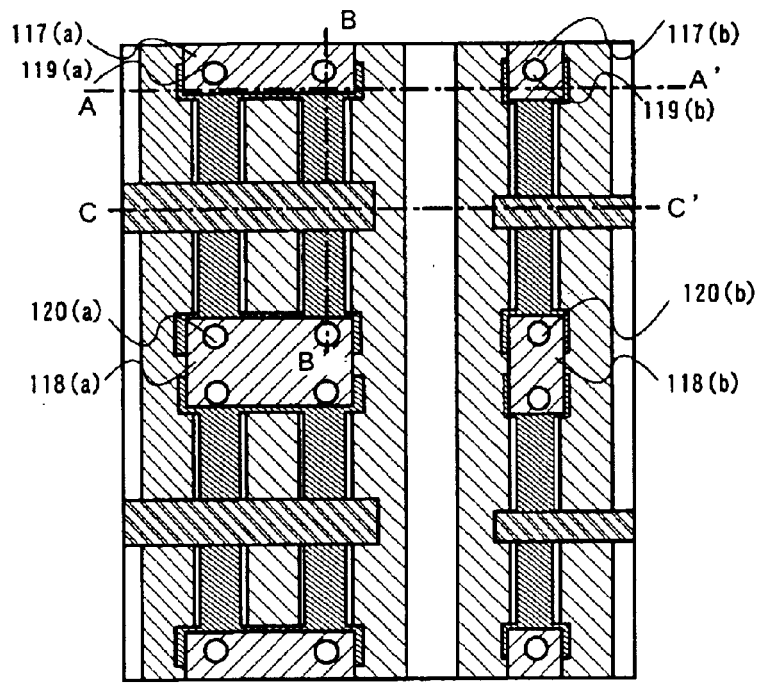
FIGS. 6A, 6B, 6C, and 6D are a top view and sectional views explaining the method of fabricating the transistor of the invention.
Figure 6B:
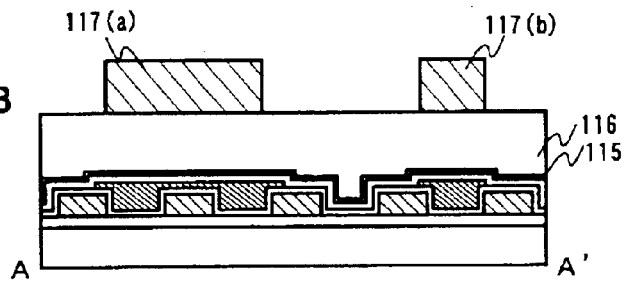
Figure 6C:
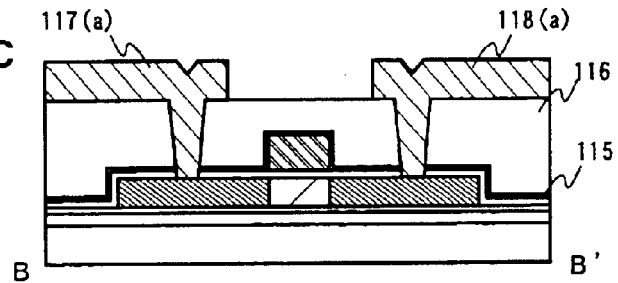
Figure 6D:
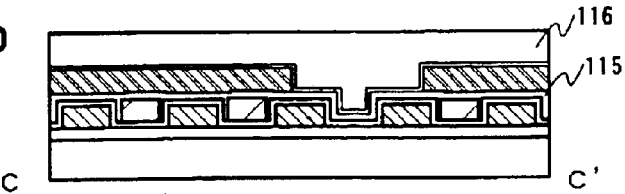

Next, FIG. 6 will be described. FIG. 6A is a top view, and FIG. 6B is a sectional view corresponding to A–A', and FIG. 6C is a sectional view corresponding to B–B', and FIG. 6D is a sectional view corresponding to C–C'. They shows such a situation that even source wirings 117(a) and 117(b) and drain wirings 118(a) and 118(b) are formed and a p-channel type thin film transistor is accomplished.

When the above-described activation process is finished, a protective film (passivation film) 115 so as to cover the gate electrode 111 etc. is formed. As the protective film 115, it is desirable to use an insulating film in which content of nitrogen is high such as a silicon nitride film, a silicon nitride-oxide film, an aluminum nitride film or an aluminum nitride-oxide film. This is to exclude an influence of alkali metal, moisture etc.

In addition, in this embodiment, the silicon nitride-oxide (SiNxOy) film is used as the protective film 115, and after the film formation, heat treatment of 400–450° C. is carried out. Since the protective film 115 includes hydrogen of 15–25 atom %, hydrogen is diffused by the heat treatment, and even if there are dangling bands in the channel forming regions 114a and 114b, it is effectively terminated by hydrogen.

After the protective film 115 is formed, then, as an interlay film (interlayer insulating film) 116, the silicon oxide film, the silicon nitride film, the silicon nitride-oxide film or the silicon oxynitride film or a laminated film of them is formed. Of course, if heat resistance allows, a resin film may be used. Film thickness is not limited in particular but, desirable is film thickness by which the surface of the interlayer film 116 can be sufficiently flattened. In addition, after the interlayer film 116 is formed, planarization may be carried out by use of well known means such as CMP(chemical mechanical polishing) etc.

And, contact holes are formed in the interlayer film 116 etc., and the source wirings 117(a) and 117(b) and drain wirings 118(a) and 118(b) are formed by a lamination film of an aluminum film or a laminated film of the aluminum film and other metal film. Of course, instead of aluminum, copper or other low resistance conductor may be used. In addition, 119(a) and 119(b) designate areas where the source regions 112(a) and 112(b) are connected to the source wirings 117(a) and 117(b) respectively, and are called as source contacts. Also, 120(a) and 120(b) designate areas where the drain regions 113(a) and 113(b) are connected to the drain wirings 118(a) and 118(b) respectively, and are called as drain contacts. In this embodiment, since the source region and the drain region are formed covering the depressions and the projections formed by the second insulating film, it is possible to broaden the design margin for forming the source contacts 119(a) and 119(b) and the drain contacts 120(a) and 120(b).

In addition, a left side p-channel type transistor shown in FIG. 6D is of such a structure that a plurality of channel forming regions (two channel forming regions in this embodiment) are arranged in parallel, and disposed juncturally between a pair of impurity regions (the source region 112(a) and the drain region 113(a) in this embodiment), i.e., is a transistor of multi-channel structure. Also, width of the channel forming regions of this left side p-channel type thin film transistor is considered to be sum of widths of the two channel forming regions.

Figure 18:
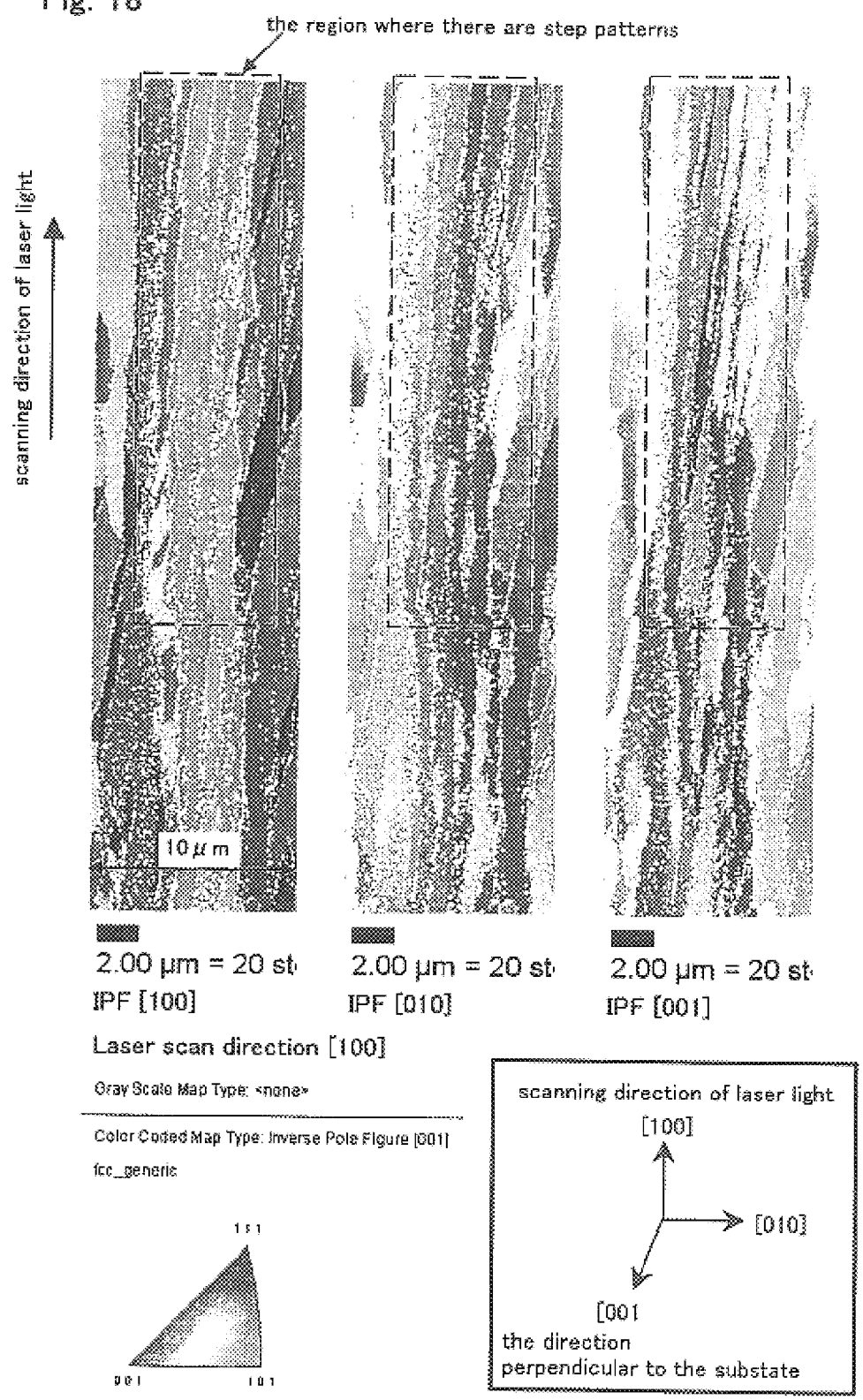
FIG. 18 is a view showing crystallinity of a transistor of the invention.

Also, FIG. 18 shows a result that an orientation of the crystalline semiconductor film formed in the depressions is obtained by EBSP(Electron Backscatter Diffraction Pattern). EBSP is one which measures microscopic crystallinity in not only surface orientation but also overall directions of a crystal by such a manner that SEM(Scanning Electron Microscopy) is provided with an exclusive detector, and an electron beam is irradiated to a crystalline plane, and identification of a crystal orientation from a Kikuchi line is image-recognized by a computer (hereinafter, this technique is called as EBSP method as a matter of convenience).

Data in FIG. 18 shows that in the depressions, crystal is grown in a direction parallel to a scanning direction of laser light which is concentrated in a line shape. It is confirmed from FIG. 18 that plane directions of the growth are aligned almost uniformly in the same stripe (depression).

As described, according to the invention, it is possible to align the crystallinity of the crystalline semiconductor film formed in the same line on the insulating surface in the stripe shape, in short, the plane direction of the crystal growth. And, the invention can reduce characteristic variation between the thin film transistors having the crystalline semiconductor film on the same line as the channel forming region.

Embodiment 2

As a formation method of the crystalline semiconductor film of this invention, as shown in the embodiment 1, melting and recrystallization may be satisfactory by irradiating laser beams further after crystallization by solid phase growth, other than the method which irradiates laser beams onto an amorphous semiconductor film to crystallize.

For example, after an amorphous semiconductor film 105 is formed in FIG. 2, nickel is doped as metallic elements with catalyst effect to promote crystallization in such a way that the crystallization temperature of the amorphous semiconductor film (for example, amorphous silicon film) is lowered, and the orientation thereof is raised.

This technique is described in detail in JP-A-11-354442 by this applicant. A crystalline semiconductor film obtained by combining a technique of doping nickel and the technique in Embodiment 1 also has a characteristic of uniform crystallinity. If such crystalline semiconductor films are used for the channel forming regions of thin-film transistors, both mobility of electron and that of hole improve significantly, with the result that field effect mobility of a n-channel transistor and a p-channel transistor improve as well.

Moreover, the method of doping nickel is not limited, and such as spin coating, vapor deposition and sputtering can be applied. When based on spin coating, 5 ppm nickel acetate solution is coated to form a layer including a metallic element. Of course, a catalyst element is not limited to nickel but other well-known materials may be used.

After the formation, the amorphous semiconductor film 105 is crystallized by a heat treatment for 4 hours at 580° C. Laser beams or a strong light equivalent to the laser beams are irradiated onto this crystallized semiconductor film, so as to cause a melting state and re-crystallization. In this way, the crystalline semiconductor with a substantially planarized surface can be obtained in a similar manner as shown in FIG. 2.

The advantage of using a crystallized semiconductor film as an irradiating object by laser beams is the variation ratio of the optical transmittance of the semiconductor film. Even if laser beams are irradiated onto the crystallized semiconductor film to cause a melting state, an optical absorption coefficient is hardly changed. Therefore, large margins of laser irradiation conditions can be specified.

In this way, metallic elements remain in the formed crystalline semiconductor film, but can be removed by a gettering treatment. This technique is described in detail in Patent Application No. 2001-019367(or Patent Application No. 2002-020801) as references. Moreover, the heat-treatment accompanied with this gettering treatment also has the effect of easing deviation of the crystalline semiconductor film.

Then, as similar to Embodiment 1, a thin-film transistor defining a crystalline semiconductor film of a depression as a channel forming region and defining a crystalline semiconductor film on projections as a source region or a drain region is formed. As described, according to the invention, it is possible to align the crystallinity of a crystalline semiconductor film formed in the same line on the insulating surface in the stripe shape, in short, the plane direction of the crystal growth. And, the invention can reduce variation between the thin film transistors having the crystalline semiconductor film on the same line as the channel forming regions.

Embodiment 3

Next, by use of FIG. 8, an example will be described, in which length of the stripe pattern is such level of length that the channel forming region of the transistor can be formed.

Figure 8A:
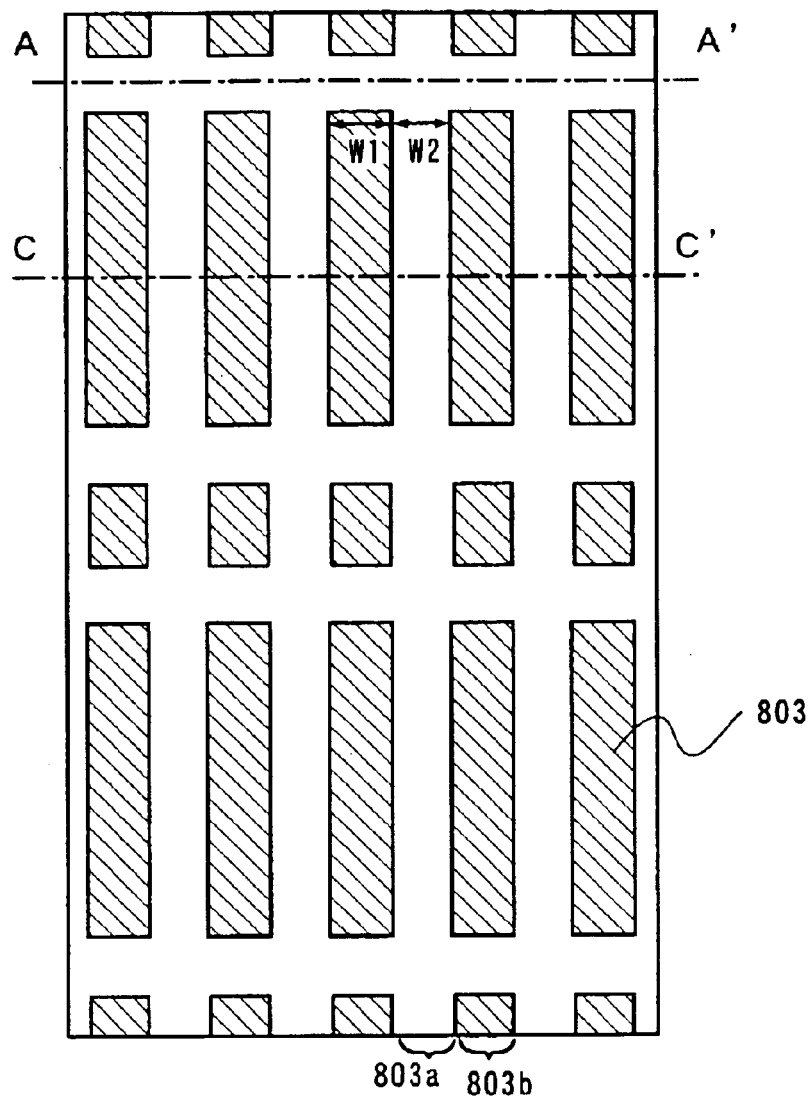
FIGS. 8A, 8B, and 8C are a top view and sectional views explaining the method of fabricating the transistor of the invention.
Figure 8B:
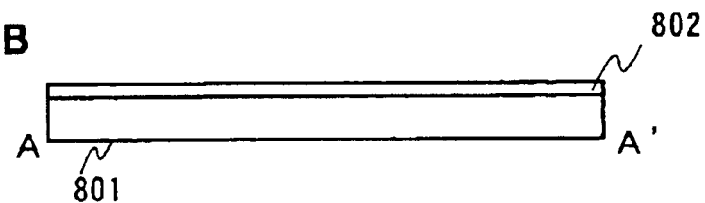
Figure 8C:
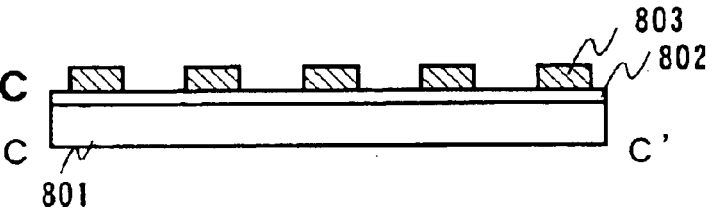

FIG. 8 is a top view, and FIG. 8B is a sectional view corresponding to A–A', and FIG. 8C is a sectional view corresponding to C–C'. They shows such a situation that a first insulating film 802 and a second insulating film 803 formed in linear stripe patterns are formed on a substrate 801. In addition, a portion shown by 803a indicates a depression, and a portion shown by 803b indicates a projection.

A feature of this embodiment is that the length of the linear stripe pattern is set to be such a level that a channel forming region are of a transistor can be formed. That is, looking at the sectional view of A–A', the second insulating film 803 is not disposed, and looking at the sectional view of C–C', the second insulating film 803 is disposed in a stripe shape. Also, the first insulating film and the second insulating film may be formed by use of a material and a fabricating method which are similar to those in Embodiment 1.

Also, in the same manner as in Embodiment 1, it is desirable that width (W1) of the second insulating film 803 which is formed in a linear stripe pattern is 0.1–10 μm (preferably 0.5–1 μm) and an interval (W2) between the neighboring second insulating films are 0.01–2 μm (preferably 0.1–1 μm), and thickness (d) of the second insulating film is 0.01–3 μm (preferably 0.1–2 μm).

Thereafter, in the same manner as in Embodiment 1, an insulating film 804 which functions as a buffer (hereinafter, referred to as a buffer film) is formed so as to cover surfaces including the first insulating film 802 and the second insulating film 803, and depressions 803a, and thereafter, an amorphous semiconductor film is continuously formed to be of thickness of 0.01–3 μm (preferably, 0.1–1 μm) without releasing into atmosphere.

Figure 9A:
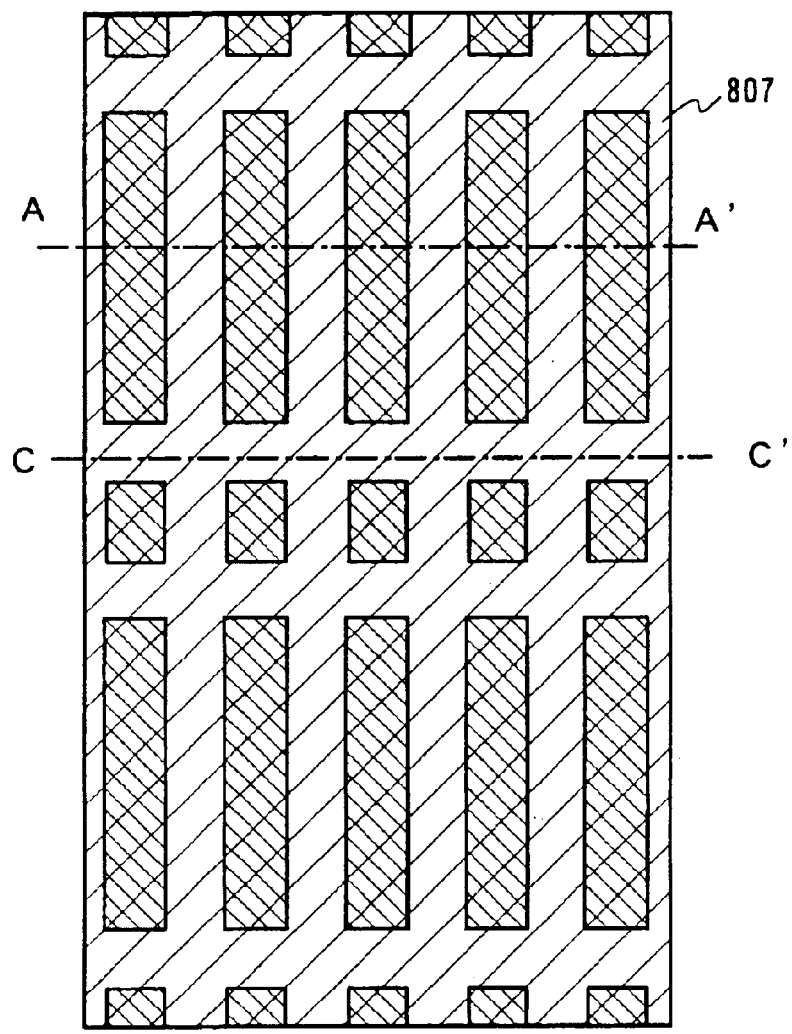
FIGS. 9A, 9B, and 9C are a top view and sectional views explaining the method of fabricating the transistor of the invention.
Figure 9B:
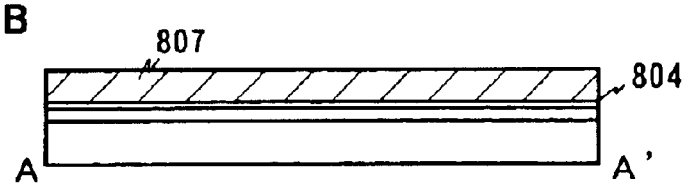
Figure 9C:
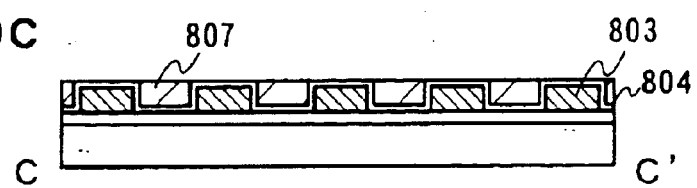
Figure 10A:
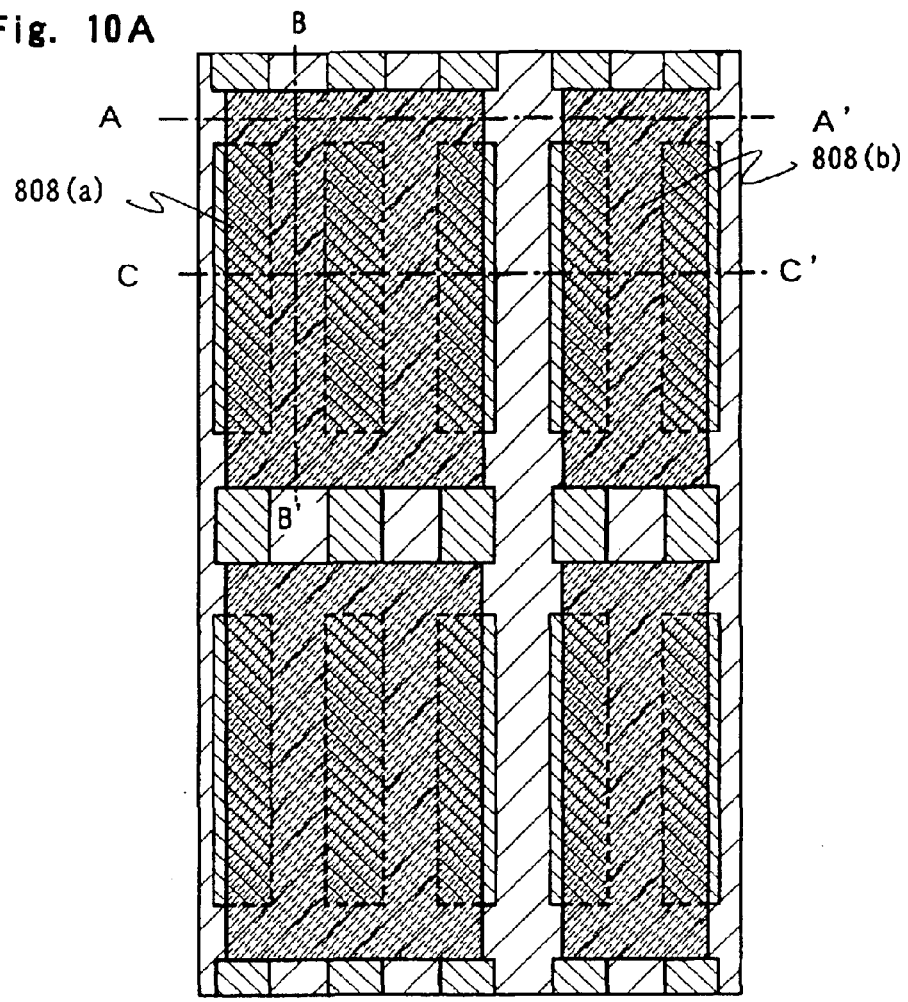
FIGS. 10A, 10B, 10C, and 10D are a top view and sectional views explaining the method of fabricating the transistor of the invention.
Figure 10B:
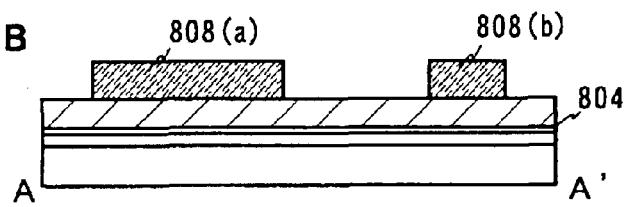
Figure 10C:
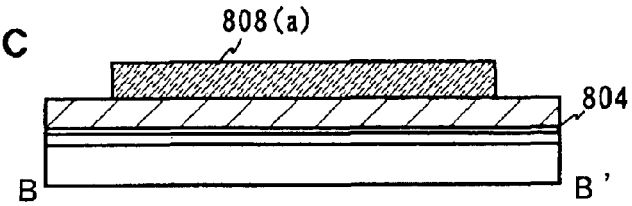
Figure 10D:
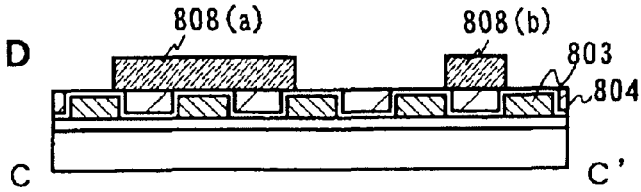

Next, FIG. 9 will be described. FIG. 9 shows that, by irradiating continuous wave line-shaped laser light to the amorphous semiconductor film, a crystalline semiconductor film 807 is obtained. FIG. 9A is a top view, and FIG. 9B is a sectional view corresponding to A–A', and FIG. 9C is a sectional view corresponding to C–C'.

After that, the crystalline semiconductor film 807 is etched by dry etching or wet etching to expose the second insulating film 803 (or the buffer film 804 thereon). By this process, it is possible to selectively remain the crystalline semiconductor film 807 only in the depressions (FIG. 9C). At this time, since the second insulating film does not exist in the source region and the drain region, there is no necessity to dispose resist masks for remaining the crystalline semiconductor film for use in the source wiring and the drain wiring. Therefore, by the shape of the second insulating film 803 in this embodiment and by etching the crystalline semiconductor film 807, it is possible to reduce the number of masks.

In addition, the abode-described etching process may be not only dry etching method or wet etching method but also a mechanical polishing method such as CMP(Chemical Mechanical Polishing). Also, there occurs no problem to use a chemical method and a mechanical method at the same time.

Next, as shown in FIG. 10, resist masks 808(a) and 808(b) are formed. Also, FIG. 10A is a top view, and FIG. 10B is a sectional view corresponding to A–A', and FIG. 10C is a sectional view corresponding to B–B', and FIG. 10D is a sectional view corresponding to C–C'. The crystalline semiconductor film is patterned by using the resist masks 808(a) and 808(b) as masks and island-shaped semiconductor films are obtained.

As to other processes to be carried out after this, there is no problem to refer to the processes described in Embodiment 1, and descriptions in this embodiment will be omitted.

This embodiment is characterized in that there is no insulating film 803 in the source region and the drain region of the island-shaped semiconductor film formed. As just described, since there is no insulating film 803 in the source region and the drain region, loared is a possibility that the source wiring and the drain wiring are disconnected, and further, bad contacts are reduced, and degree of freedom for circuit design of a semiconductor device is increased.

Also, according to this embodiment, since the channel forming region can be formed in a self-aligning manner by the second insulating film 803, it is possible to prevent the channel forming region from being formed erroneously on the projection of the second insulating film due to pattern misalignment when the channel forming region is formed, and it is possible to decrease such as case that the crystal grain boundary is included in the channel forming region, and it is possible to improve process yield.

In addition, the process in which the crystalline semiconductor film 807 is etched by dry etching or wet etching to expose the second insulating film 803 (or the buffer film 804 thereon) in this embodiment can be combined with Embodiments 1 and 2.

Embodiment 4

Figure 11A:
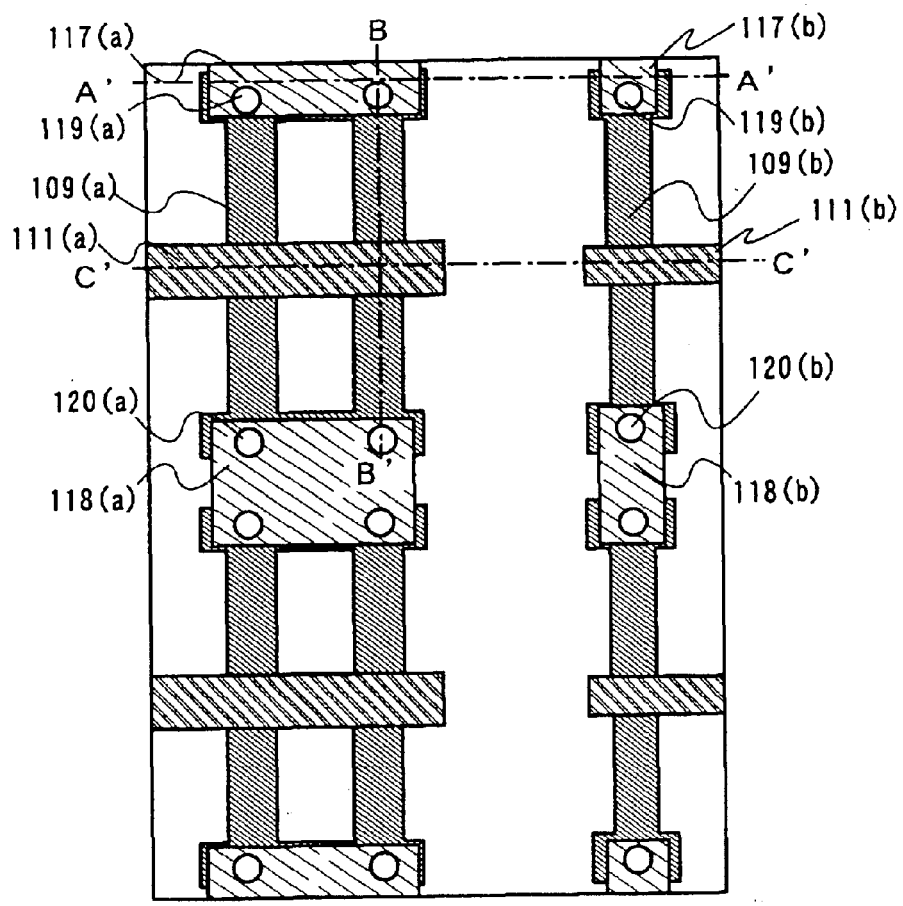
FIGS. 11A, 11B, 11C, and 11D are a top view and sectional views explaining the method of fabricating the transistor of the invention.
Figure 11B:
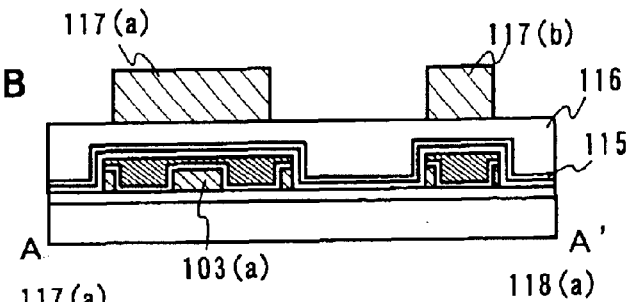
Figure 11C:
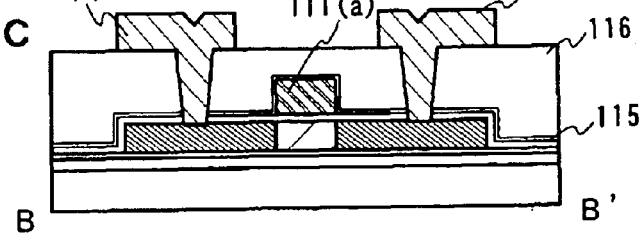
Figure 11D:
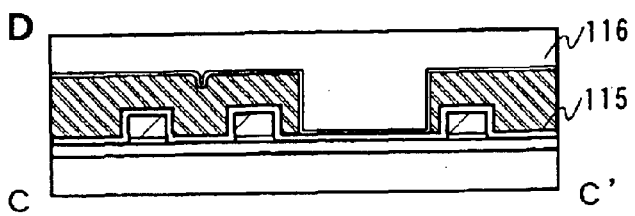

This embodiment shows an example in which, after the island-shaped semiconductor films 109(a) and 109(b) are formed in Embodiment 1, the second insulating film 103 is removed. In addition, FIG. 11A is a top view of a thin film transistor in case that this embodiment is carried out, and FIGS. 11B to 11D are sectional views in case of cutting FIG. 11A along lines A–A', B–B' and C–C'. Also, numerals and signs of each figure may correspond to the numerals and the signs of the figures which are used in Embodiment 1.

By such a point that the second insulating film 103 is removed in the area other than under the island-shaped semiconductor films 109(a) and 109(b) in this embodiment, as shown in FIG. 11D, a gate electrode covers even side surfaces of the island-shaped semiconductor films 109(a) and 109(b) so that width of the effective channel forming region increases and drive capability of the thin film transistor increases. Also, by this embodiment, pointed out is a point that unnecessary steps are reduced on a surface of the substrate, and since it is possible to decrease the number of such times that lead wirings such as gate wirings, source wirings, and drain wirings climb over steps formed by the second insulating film 103, it is possible to avoid defects such as disconnection due to climb-over errors.

In addition, this embodiment can be freely combined with any one of Embodiments 1 to 3.

Embodiment 5

The structure of a laser irradiation apparatus used in this embodiment will be explained referring to FIG. 12. In addition, although two sets of laser oscillation apparatuss are used in FIG. 12, the laser oscillation apparatus may not be limited to this number, but three sets or four sets, or more may be used.

Also, the temperature of a laser oscillation apparatus 11 is kept constant using a chiller 12. The chiller 12 is not necessarily formed, but keeping the temperature of the laser oscillation apparatus 11 constant makes it possible to control the fluctuation of the outputted energy of laser beams according to the temperature.

Also, numeral 14 is an optical system, and can change the light path outputted from the laser oscillation apparatus 11, or can condense laser beams by processing the form of the laser beams. Furthermore, the laser beams outputted from a plurality of the laser oscillation apparatuss 11 are synthesized by partially overlapping mutually with the optical system 14 in the laser irradiation apparatus of FIG. 12.

In addition, an AO modulator 13 which can primarily intercept laser beams completely may be formed in a light path between a processing substrate 16 and the laser oscillation apparatus 11. Moreover, instead of the AO modulator, an attenuator (light intensity correction filter) may be formed to adjust the energy density of laser beams.

Moreover, a measuring means 20 (energy density measurement means) to measure the energy density of laser beams outputted from the laser oscillation apparatus 11 may be formed in a light path between the processing substrate 16 and the laser oscillation apparatus 11, so that a change of energy density with time may be monitored by a computer 10. In this case, an output from the laser oscillation apparatus 10 may be heightened so that the attenuation of the energy density of the laser beams may be compensated.

The synthesized laser beams are irradiated onto the substrate 16, which is a processing object, through a slit 15. The slit 15 is capable of intercept the laser beams and preferably formed of a material resistant to transformation or damage by the laser beams. And the width of the slit 15 is variable and the width of the laser beams can be changed by the width of the slit accordingly. In addition, the slit is not always necessary to be provided.

In addition, shapes of the laser beams on the substrate 16 which are oscillated from the laser oscillation apparatus 11 in case of not passing through the slit 15 are different according to kinds of laser, or can be formed by an optical system.

The substrate 16 is laid on the stage 17. In FIG. 12, the position control means 18 and 19 are control means to control the position of the laser beams on a processing object, and the position of the stage 17 is controlled by the position control means 18 and 19. In FIG. 12, the position control means 18 performs position control of the position of the stage 17 in the X direction, and the position control means 19 performs position control of the stage 17 in the Y direction.

Figure 12:
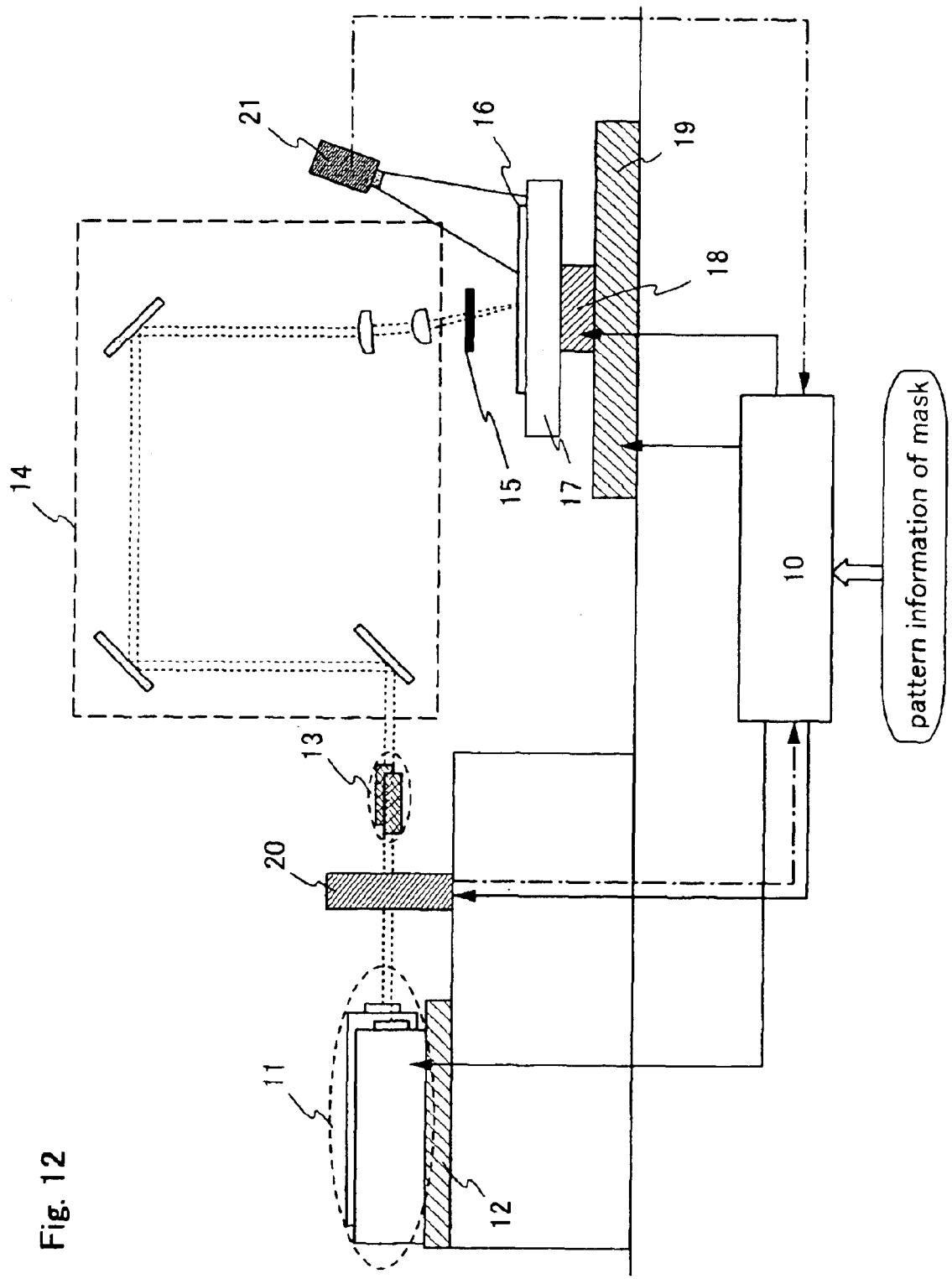
FIG. 12 is a view showing a laser irradiation apparatus which is used in an embodiment of the invention.

In addition, the position of the laser beams is controlled by moving a substrate in FIG. 12, but the movement may be carried out using optical systems, such as galvano-mirror, or both of them may be used.

Also, a laser irradiation apparatus of FIG. 12 includes a computer 10 having a memory means such as a memory and central processing units. The computer 10 controls the oscillation of the laser oscillation apparatus 11, defines the scanning course of the laser beams, and the position control means 18 and 19 are controlled so that the laser beams may be scanned according to the predetermined scanning course, to thereby move the substrate to a predetermined position.

Furthermore, in FIG. 12, the width of the slit 15 can be controlled by the computer 10, and the width of the laser beams can be changed according to pattern information of a mask.

Furthermore, the laser irradiation apparatus may be equipped with a correction means to adjust a temperature of a processing object. Also, since the laser beams have directivity and a high energy density, a damper may be formed to prevent refracted light from irradiating onto an improper part. Damper is preferably to be absorbent for the refracted light. In addition, cooling water may be circulated in a damper beforehand to prevent the temperature of a wall from rising by absorption of the reflected light. Moreover, a heating means (substrate heating means) for heating the substrate may be formed in the stage 17.

In addition, when forming markers for referring for mask alignment by laser light, a laser oscillation apparatus for markers may be formed. In this case, oscillation of the laser oscillation apparatus for markers may be controlled by the computer 10. Furthermore, when forming a laser oscillation apparatus for the markers, an optical system for condensing the laser beams outputted from the laser oscillation apparatus for the markers is formed separately. In addition, as for a laser beam used when the marker is formed, such as YAG laser and $CO_2$ laser beams are applied typically. However, other laser beams can also be used for making a marker, of course.

Moreover, for alignment by use of a marker, one set of a CCD camera 21, or several CCD cameras in other cases, may be provided. Incidentally, a CCD camera means the camera using a CCD (charge coupled device) as an image sensor. Moreover, without establishing a marker, patterns of an insulating film or a semiconductor film is recognized by the CCD camera 21 and alignment of the substrate may be performed. In this case, by comparing pattern information on an insulating film by the mask and a semiconductor film inputted into the computer 10 with the pattern information on the actual insulating film or a semiconductor film collected by the CCD camera 21, the position information on the substrate can be grasped. In this case, the marker is not necessarily established separately.

Moreover, laser beams incident to the substrate are reflected on the surface of the substrate and return in the same path as when it was incident. Here, the returning laser light is so called a return light. However, this return light has adverse influences, such as an changes of output and frequency of the laser light, and destruction of a rod. Therefore, in order to remove the return light and to stabilize the oscillation of laser, an isolator may be installed.

In addition, the constitution of a laser irradiation apparatus having a plurality of laser oscillation apparatuses formed therein is shown in FIG. 12. The constitution described above has a merit that the designing of an optical system becomes easy. When a semiconductor film is melted, it is preferable to use linear laser beams especially from a viewpoint of the improvement of a throughput. However, if the longer direction of laser beams (X-axis direction in FIG. 2) becomes further longer, the optical design becomes very precise. Therefore, a burden of an optical design can be mitigated by using a plurality of linear laser beams in an overlapped manner.

For example, one linear laser beam can be formed by optically compounding a plurality of laser beams oscillated from a plurality of laser oscillation apparatuses. FIG. 13A is a view showing the irradiation section of each laser beam. The case where the irradiation region of laser beams serves as ellipse shape is mentioned as the example here. However, there is no difference depending on shapes.

The shape of laser beams is varied according to the kinds of laser, and can be formed by the optical system also. For example, the shape of the laser beams irradiated from the XeCl excimer laser apparatus L3308, produced by Ramda Co. LTD. (wavelength of 308 nm and pulse width of 30 ns) provides a rectangle shape of 10 mm×30 mm (referring to half-power bandwidth in beam profiles). Also, the shape of the laser beam irradiated from YAG laser beam apparatus becomes circular if the rod has a cylinder shape. If it is a slab type, the shape of the laser beam becomes rectanglar. The laser beam with a desired size can also be formed by fabricating such laser beams further by the optical system.

The distribution of the energy density of the laser beam in the major axis direction of the laser beams (X-axis direction) shown in FIG. 13A is shown in FIG. 13B. The laser beam shown in FIG. 13A corresponds to the region where $1/e^2$ of energy density of peak value in FIG. 13B is satisfied. The distribution of the energy density of the ellipse-shaped laser beam is increased as becoming closer to the center O of the ellipse. Thus, the energy density of the laser beam shown in FIG. 13A in the direction of a main axis follows Gaussian distribution, and the region as judged to be uniform in energy density becomes narrow.

Next, an irradiation sectional shape of the linear laser beam made up of two laser beams shown in FIG. 13A, which are synthesized, is shown in FIG. 13C. In addition, FIG. 13C shows the case where one linear laser beam is formed by overlapping two laser beams. The number of the laser beams to be overlapped is not limited thereto.

As shown in FIG. 13C, the major axes of the ellipse of the laser beams correspond, and synthesized by partially overlapping parts of the laser beams to produce one linear laser beam. In addition, hereafter, the straight line obtained by connecting the center O of each ellipse is set as the center axis of the laser beam.

The distribution of the energy density in the center axis X direction of the linear laser beam after synthesis shown in FIG. 13C is shown in FIG. 13D. In addition, the laser beam shown in FIG. 13C corresponds to the region where $1/e^2$ of energy density of peak value in FIG. 13B is satisfied. Energy density is added in the portion where each laser beam before synthesis is overlapped. For example, if the energy densities L1 and L2 of the overlapped laser lights are added as shown in the figure, it becomes almost equal to the peak value L3 of the energy density of each laser beam, and flattening of the energy density is occurred between the centers O of each ellipse.

In addition, it is ideal to become equal to L3 if L1 and L2 are added. However realistically, it does not necessarily become an equal value. The permissible deviation level between the value by adding L1 and L2 and the value L3 can be suitably set up by the designer.

If a laser light is used independently, since energy density follows Gaussian distribution, it is difficult to irradiate a laser beam of uniform energy density onto the whole semiconductor film which is in contact with the flat portion of the insulating film. However, as shown in FIG. 13D, by overlapping a plurality of laser beams and compensating a part where energy density is lower, the region with uniform energy density is expanded so as to raise the crystallinity of a semiconductor film efficiently compared with the case where a plurality of laser beams are not used in an overlapping manner, but used independently.

In addition, as for the distribution of energy density, B–B' is a little smaller than C–C'. However, B–B' and C–C' can be considered to be almost the same size. And the shape of the laser beam synthesized in the region with energy density of the $1/e^2$ of the peak value of the laser beam before synthesis can be said as linear.

In addition, the region where energy density is low exists in the neighborhood of outer edge of the irradiation region of the synthesized linear laser beam. Since crystallinity may be spoiled on the contrary if this region is used, it can be a more preferable form not to use the outer edge of the linear laser beam, but use the slit 15 as shown in FIG. 12.

In carrying out laser beam irradiation of this invention, the laser irradiation apparatus explained in this embodiment can be used. It can be adapted for anyone of the embodiments 1 to 4. Moreover, even if linear laser beams have advantages, there arises a problem of raising the cost of the optical system or laser oscillation apparatus. If a desired linear laser beam can be obtained in one set of a laser oscillation apparatus and an optical system, it is satisfactory to practically use such a laser irradiation apparatus.

EXAMPLES

Example 1

This example describes a current mirror circuit and a differential amplifier circuit as an analog circuit which is formed by use of the invention.

FIGS. 14A-1 and 14A-2 show an equivalent circuit diagram of the current mirror circuit and a top view of a layout example. In addition, polarities of thin film transistors 1510 and 1511 which the current mirror circuit has are of p-channel type by way of example.

Looking at FIGS. 14A-1, a power line Vdd and drain electrodes of the thin film transistors 1510 and 1511 are connected, and the gate electrode of the thin film transistor 1510 and the gate electrode and the source electrode of the thin film transistor 1511 are connected, and the source electrode of the thin film transistor 1511 is connected to Vss through a current source. Thin film transistors which is required to have conformance are the thin film transistors 1510 and 1511 surrounded by the dotted line.

Also, looking at FIGS. 14A-2, the gate electrode is disposed on an island-shaped semiconductor film which is formed between insulating films, and thereafter, source wiring or drain wiring is disposed. And, the source wiring and the drain wiring are connected to the impurity regions (the source region and the drain region) of the island-shaped semiconductor film through contact holes. And, channel forming regions of the thin film transistors 1510 and 1511 are formed from the crystalline semiconductor film on the same line.

That is, among thin film transistors which configure the current mirror circuit as the analog circuit, the channel forming regions of the thin film transistors with at least the same polarity are formed on the same line. And, among thin film transistors which configures the current mirror circuit as the analog circuit, channel forming regions of the thin film transistors which share at least a gate electrode (i.e., thin film transistors which are electrically connected to the same gate electrode) are formed on the same line.

This island-shaped semiconductor film may be formed by any method of Embodiments 1 to 5.

Also, it goes without saying that polarities of the thin film transistors which the current mirror circuit has may be of n-channel type.

FIGS. 14B-1 and 14B-2 shows an equivalent circuit diagram of the differential amplifier circuit and a top view of a layout example. In addition, polarities of thin film transistors 1512 and 1513 which the differential amplifier circuit has are of p-channel type and polarities of 1514, 1515, and 1600 are of n-channel type by way of example.

Looking at FIGS. 14B-1, a power line Vdd and drain electrodes of the thin film transistors 1512 and 1513 are connected. Also, a gate electrode of the thin film transistor 1512 and a gate electrode and a source electrode of the thin film transistor 1513 are connected. Also, a source electrode of the thin film transistor 1512 and a source electrode of the thin film transistor 1514 are connected. Also, the source electrode of the thin film transistor 1513 and the source electrode of the thin film transistor 1515 are connected. Also, the drain electrode of the thin film transistor 1514 and the drain electrode of the thin film transistor 1515 are connected to Vss through the thin film transistor 1600. Also, thin film transistors which are required to have conformance are the thin film transistors 1512 and 1513 surrounded by a dotted line, and the thin film transistors 1514 and 515.

Also, looking at FIGS. 14B-2, a gate electrode is disposed on an island-shaped semiconductor film which is formed between insulating film, and thereafter, a source wiring or a drain wiring is disposed. And, the source wiring and the drain wiring are connected to the impurity regions (the source region and the drain region) of the island-shaped semiconductor film through contact holes. Also, it is shown that channel forming regions of the thin film transistors 1512 and 1513 which are surrounded by a dotted line and required to have conformance are formed from a crystalline semiconductor film on the same line, and channel forming regions of the thin film transistors 1514 and 1515 which are surrounded by another dotted line and required to have conformance are formed from the crystalline semiconductor film on the same line.

That is, among thin film transistors which configures the differential amplifier circuit as the analog circuit, the channel forming regions of the thin film transistors with at least the same polarity are formed on the same line. Also, among thin film transistors which configures the differential amplifier circuit as the analog circuit, channel forming regions of the thin film transistors which share at least a gate electrode (i.e., thin film transistors which are electrically connected to the same gate electrode) are formed on the same line. Also, in an analog circuit to which a plurality of input signals are applied, channel forming regions of thin film transistors with the same polarity having gate electrodes to which the same input signal is inputted are formed on the same line.

In addition, FIGS. 14A-1 to 14B-2 describe such an example that the number of the island-shaped semiconductor films which function as the channel forming regions of the p-channel type thin film transistors is 3 and the number of the island-shaped semiconductor films which function as the channel forming regions of the n-channel type thin film transistors is 2 but the invention is not limited to this. A designer may properly design from field effect mobility of the thin film transistor and characteristics necessary for a circuit. In addition, the lengths in channel width direction of the island-shaped semiconductor films which configure the channel forming regions of the p-channel type thin film transistors may be different from those of the n-channel type thin film transistors. However, it is desirable that it is common in order to secure margin in a crystallization process and uniform crystallinity.

As described, in the invention, since crystallinity of the island-shaped semiconductor films of the thin film transistors included in the current mirror circuit and the differential amplifier circuit, which are required to have conformance is uniform, variation between those thin film transistors is small, and it is possible to obtain a current mirror circuit and a differential amplifier circuit which have high conformance. Also, since, by designating an area in which the channel forming region is formed, it becomes possible to form a crystalline semiconductor area in which a crystal grain boundary does not exist, it is possible to obtain a current mirror circuit and a differential amplifier circuit which are capable of high speed operations and have high current driving capabilities.

A pixel portion of a light emitting display device and a current source (constant current source) of a signal line drive circuit which have the current mirror circuits formed by the invention can obtain high conformance, and performance of the light emitting display device can be improved.

Example 2

This example will describe a circuit of an analog switch which is formed by the invention.

FIGS. 15A and 15B show equivalent circuit diagrams of neighboring two analog switches SW1 and SW2 (analog switches surrounded by a broken line) and a top view of a layout example. In addition, polarities of thin film transistors 1516 and 1518 which the two analog switches have are of p-channel type, and polarities of 1517 and 1519 are of n-channel type by way of example.

Thin firm transistors which are required to have conformance in the analog switch of this example are the thin film transistors 1516 and 1518, or the thin film transistors 1517 and 1519. Also, this example describes an example of the analog switch which is configured by two thin film transistors which are required to have conformance but, it goes without saying that the invention is not limited to one which is configured by two thin film transistors.

Looking at FIG. 15A, a wiring to which an input signal (Signal) is inputted and the gate electrode of the thin film transistor 1517 of SW1 and the gate electrode of the thin film transistor 1519 of SW2 are connected. A wiring to which an inversion signal (Signal b) is inputted and the gate electrode of the thin film transistor 1516 of SW1 and the gate electrode of the thin film transistor 1518 of SW2 are connected. And, an input signal $V_{IN}$ is inputted to SW1 and SW2 and an output signal $V_{OUT}$ is outputted therefrom.

Also, looking at FIG. 15B, a gate electrode is disposed on an island-shaped semiconductor film which is formed between insulating films, and thereafter, a source wiring or a drain wiring is disposed. And, the source wiring and the drain wiring are connected to the impurity regions (the source region and the drain region) of the island-shaped semiconductor film through contact holes. Also, it is shown that channel forming regions of the thin film transistors 1516 and 1518 which are required to have one conformance are formed from a crystalline semiconductor film on the same line, and channel forming regions of the thin film transistors 1517 and 1519 which are required to have another conformance are formed from a crystalline semiconductor film on the same line.

In addition, FIGS. 15A and 15B describe such an example that the number of the island-shaped semiconductor films which function as the channel forming regions of the p-channel type thin film transistors is 3 and the number of the island-shaped semiconductor films which function as the channel forming regions of the n-channel type thin film transistors is 2 but the invention is not limited to this. A designer may properly design from field effect mobility of the thin film transistor and characteristics necessary for a circuit. In addition, the lengths in channel width direction between island-shaped semiconductor films which configure the channel forming regions of the p-channel type thin film transistor and the n-channel type thin film transistor. However, it is desirable that it is common in order to secure margin in a crystallization process and uniform crystallinity.

As described, in the invention, since the channel forming regions of the thin film transistors which are required to have conformance of a plurality of analog switches are formed from the crystalline semiconductor films on the same line in which crystallinity is uniform, it is possible to obtain an analog switch in which variation between a plurality of circuits is small and characteristics are uniform.

Since a pixel part of a light emitting display device which has the analog switch formed by the invention has uniform characteristic of the analog switch by the same current signal, performance of the light emitting display device can be improved.

Example 3

This invention can be applied to various semiconductor apparatuses, and the forms of a display panel produced based on the embodiments 1 to 5 and examples 1 to 2, will be explained. In addition, as an example of the display panel shown in this example, the display panel using a transistor as a semiconductor device, such as a liquid-crystal-display panel, an EL (Electro Luminescence) display panel, and a display panel for FED (Field Emission Display), are mentioned. Of course, these display panels include a module which is currently distributed in the market.

Figures 16A, 16B, 16C:
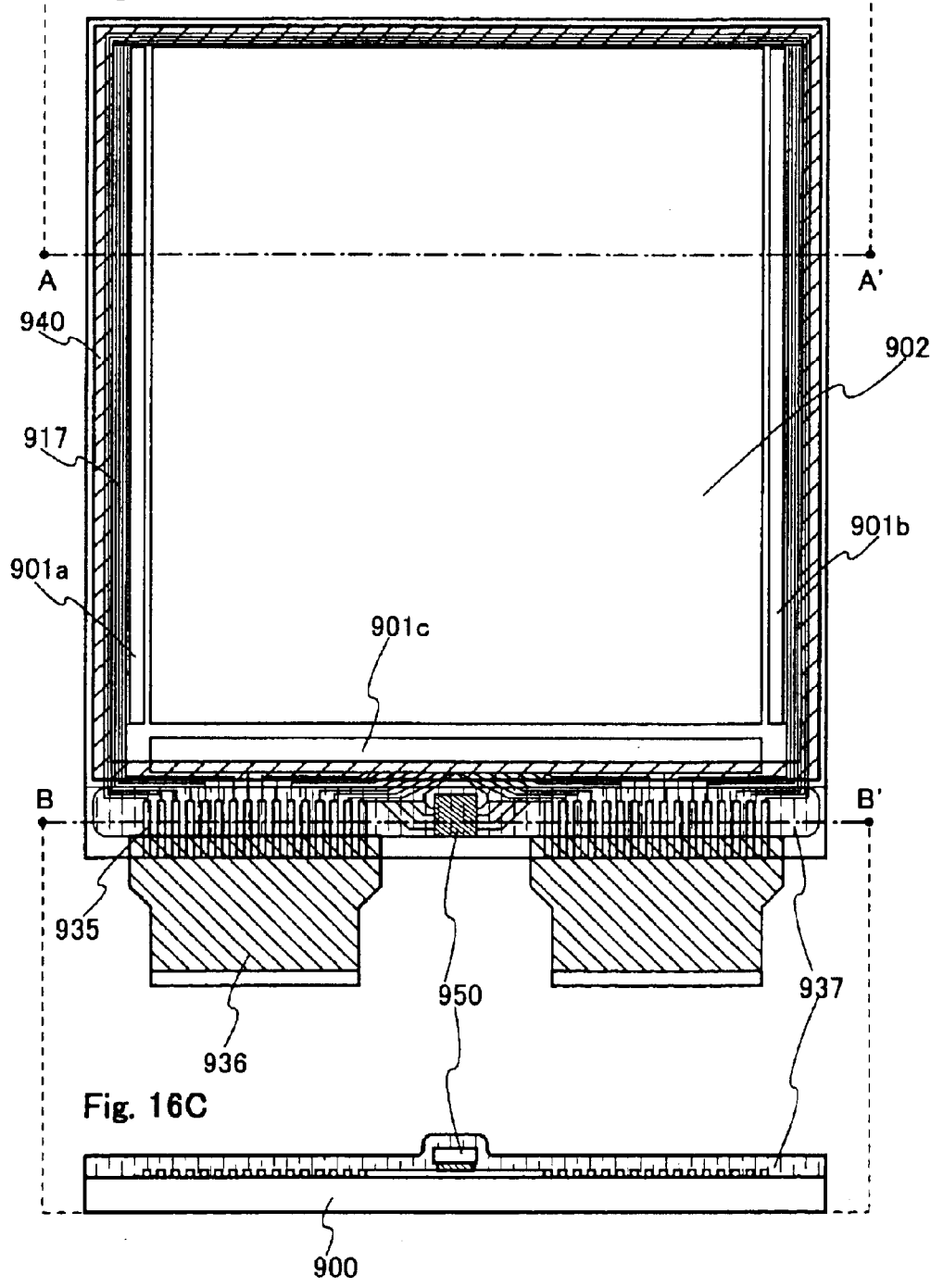
FIGS. 16A to 16C are views showing one example of an outline view of a semiconductor apparatus of the invention.

A substrate 900 of FIGS. 16A to 16C has a pixel part 902, gate signal side drive circuits 901a, 901b, a data signal side drive circuit 901c, an input-and-output terminal part, and a wiring, or a wiring group 917 formed thereon.

A seal pattern 940 is a pattern for making a sealed space between the opposite substrate 920 and the substrate 900, and in case of a liquid crystal display panel, liquid crystal is enclosed, and in case of an EL panel, EL materials (especially organic electro luminescence materials) are protected from the open air. The seal pattern may overlap with the gate signal side drive circuits 901a, 901b, data signal side drive circuit 901c, the wiring or wiring group 917, which connect the driving circuits and an input terminal. With this arrangement, the area of a frame region (a peripheral region of a pixel part) of the display panel can be reduced. In an external input terminal part, an FPC (flexible printed circuit) 936 is fixated.

Furthermore, a chip 950 having various logic circuits, a high frequency circuit, a memory, a microprocessor, a media processor/DSP (Digital Signal Processor), LSI for graphics, Code LSI, and amplifier formed therein may be mounted using transistors obtained with this invention. These functional circuits are formed with a different design rule from the pixel part 902, gate signal side drive circuits 901a, 901b, data signal side drive circuit 901c, and specifically, a design rule of 1 $\mu$m or less is applied. Incidentally, it is satisfied that the external input terminal part and chip 950 are protected with resin (such as mall resin) 937. Moreover, there is no limitation in the method of mounting, and such a system using a TAB tape and a COG (chip-on glass) system can be applied.

For example, the semiconductor integrated circuit of the present invention can be applied as switching elements of the pixel part 902, and also can be applied as active elements constituting the gate signal side drive circuits 901a, 901b, and data signal side drive circuit 901c. Of course, this example represents an example of a display panel obtained by this invention and is not limited to the constitution of FIG. 16.

Example 4

Various electronic apparatuses can be completed by using this invention. As for an example, handheld terminals (electronic notebooks, mobile computers, cellular phones, and the like), video cameras, digital cameras, personal computers, TV sets, cellular phones, and the like are mentioned. Those examples are shown in FIG. 17. In addition, the electronic apparatuses shown here are just examples, therefore the present invention is applicable particularly, but not exclusively, to those examples.

Figure 17A:
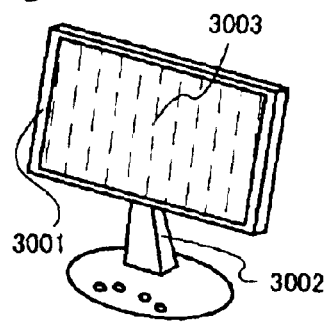
FIGS. 17A to 17G are views showing concrete examples of an electronic apparatus of the invention.

FIG. 17A is an example where a TV set is completed with the application of this invention, which is constituted by a case 3001, a support stand 3002, and a display part 3003. By using the transistors fabricated based on the present invention to integrated circuits, such as a driving circuit of the display part, a memory, other various logical circuits and the like, it becomes possible to form and incorporate the integrated circuits having high efficiency but little variation on glass to thereby constitute a TV set according to this invention.

Figure 17B:
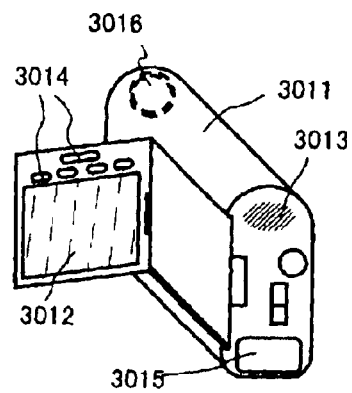

FIG. 17B is an example where a video camera is completed with the application of this invention, which is constituted by a main part 3011, a display part 3012, a voice input part 3013, an operation switch 3014, a battery 3015, and a television part 3016. By using the transistors fabricated based on the present invention to integrated circuits, such as a driving circuit of the display part, a memory, other various logical circuits and the like, it becomes possible to form and incorporate the integrated circuits having high efficiency but little variation on glass to thereby constitute a video camera according to this invention.

Figure 17C:
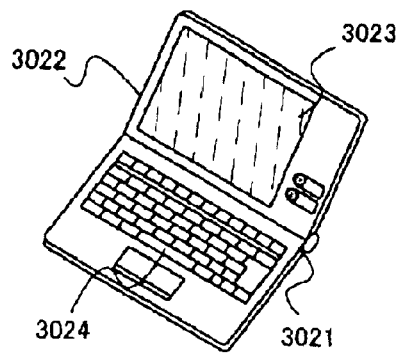

FIG. 17C is an example where a personal computer of a note type is completed with the application of this invention, which is constituted by a main part 3021, a case 3022, a display part 3023, and a keyboard 3024. By using the transistors fabricated based on the present invention to integrated circuits, such as a driving circuit of the display part, a memory, other various logical circuits and the like, it becomes possible to form and incorporate the integrated circuits having high efficiency but little variation on glass to thereby constitute a personal computer according to this invention.

Figure 17D:
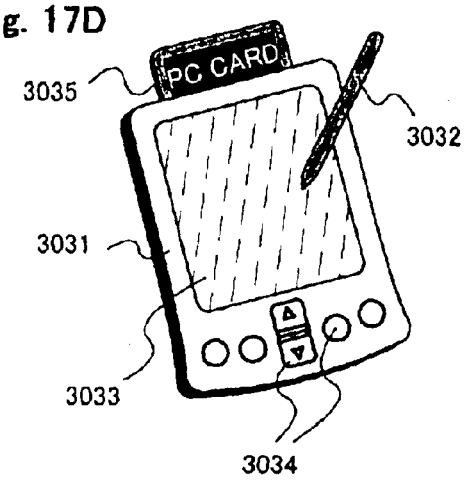

FIG. 17D is an example where PDA is completed (Personal Digital Assistant) with the application of this invention, which is constituted by a main part 3031, a stylus 3032, a display part 3033, an operation button 3034, and an external interface 3035. By using the transistors fabricated based on the present invention to integrated circuits, such as a driving circuit of the display part, a memory, other various logical circuits and the like, it becomes possible to form and incorporate the integrated circuits having high efficiency but little variation on glass to thereby constitute a PDA according to this invention.

Figure 17E:
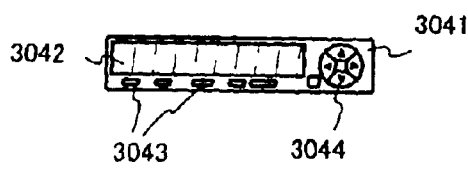

FIG. 17E is an example where a sound playback apparatus such as on-board audio device specifically is completed with the application of this invention, which is constituted by a main part 3041, a display part 3042, an operation switches 3043 and 3044. By using the transistors fabricated based on the present invention to integrated circuits, such as a driving circuit of the display part, a memory, other various logical circuits and the like, it becomes possible to form and incorporate the integrated circuits having high efficiency but little variation on glass to thereby constitute an audio apparatus according to this invention.

Figure 17F:
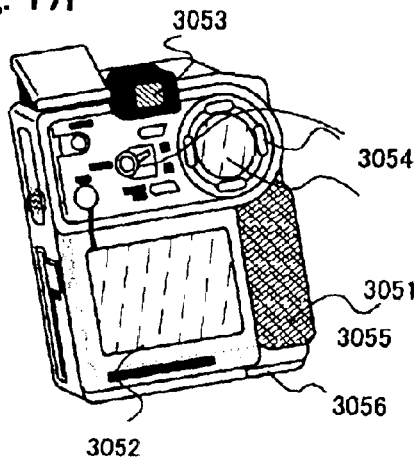

FIG. 17F is an example where a digital camera is completed with the application of this invention, which is constituted by a main part 3051, a display part A 3052, an eyepiece part 3053, an operation switch 3054, a display part B 3055, and a battery 3056. By using the transistors fabricated based on the present invention to integrated circuits, such as a driving circuit of the display part, a memory, other various logical circuits and the like, it becomes possible to form and incorporate the integrated circuits having high efficiency but little variation on glass to thereby constitute a digital camera according to this invention.

Figure 17G:
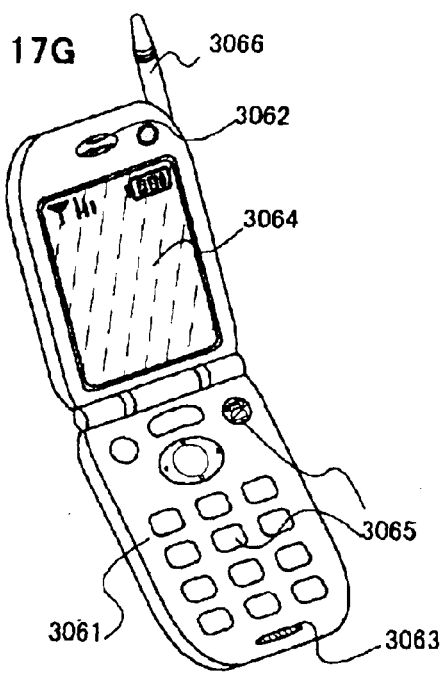

FIG. 17G is an example where a cellular phone is completed, and constituted by a main part 3061, a voice output part 3062, a voice input part 3063, a display part 3064, an operation switch 3065, and an antenna 3066. By using the transistors fabricated based on the present invention to integrated circuits, such as a driving circuit of the display part, a memory, other various logical circuits and the like, it becomes possible to form and incorporate the integrated circuits having high efficiency but little variation on glass to thereby constitute a cellular phone according to this invention.

According to this invention, it is possible to form and obtain channel forming regions from crystalline semiconductor films having uniform crystallinity on the same line.

Also, the invention forms a plurality of semiconductor devices which are required to have conformance from the crystalline semiconductor films having uniform crystallinity-on the same line, and can provide a semiconductor circuit in which variation between semiconductor devices is small, and can provide a semiconductor integrated circuit having high conformance.

Further, the invention can, in a plurality of analog circuits (for example, between analog switch circuits), provide a semiconductor circuit in which variation between the analog switches is small.

Also, the invention, by designating an area in which the channel forming region is formed, forms crystalline semiconductor areas in which a crystal grain boundary does not exist in that area, and can provide a semiconductor integrated circuit which is configured by a semiconductor device or a group of semiconductor devices which are capable of high speed operations and has high current driving capability.

And, reliability of a flat panel type display device represented by a liquid crystal display device and EL (electroluminescence) display device which have the semiconductor integrated circuits of the invention can be improved.

What is claimed is:
1. A semiconductor circuit comprising:
a first projection comprising a stripe shaped insulating film over an insulating surface;
a second projection comprising a stripe shaped insulating film over an insulating surface;
a first thin film transistor comprising;
a first crystalline semiconductor film comprising a first channel forming region between the first and second projections; and
a first gate electrode over the first crystalline semiconductor film with a gate insulating film therebetween;
a second thin film transistor comprising;
a second crystalline semiconductor film comprising a second channel forming region between the first and second projections; and
a second gate electrode over the second crystalline semiconductor film with the gate insulating film therebetween,
wherein the channel forming regions do not substantially include a crystal grain boundary.

2. A semiconductor circuit comprising:
a first projection comprising a stripe shaped insulating film over an insulating surface;
a second projection comprising a stripe shaped insulating film over an insulating surface;
a first thin film transistor comprising;
a first crystalline semiconductor film comprising a first channel forming region between the first and second projections; and
a first gate electrode over the first crystalline semiconductor film with a gate insulating film therebetween;
a second thin film transistor comprising;
a second crystalline semiconductor film comprising a second channel forming region between the first and second projections; and
a second gate electrode over the second crystalline semiconductor film with the gate insulating film therebetween,
wherein the channel forming regions do not substantially include a crystal grain boundary; and
wherein the first and second channel forming regions are aligned in the channel length direction thereof.

3. A semiconductor circuit comprising:
a first projection comprising a stripe shaped insulating film over an insulating surface;
a second projection comprising a stripe shaped insulating film over an insulating surface;
a first thin film transistor comprising;
a first crystalline semiconductor film comprising a first channel forming region between the first and second projections; and
a first gate electrode over the first crystalline semiconductor film with a gate insulating film therebetween;
a second thin film transistor comprising;
a second crystalline semiconductor film comprising a second channel forming region between the first and second projections; and
a second gate electrode over the second crystalline semiconductor film with the gate insulating film therebetween,
wherein the channel forming regions do not substantially include a crystal grain boundary; and
wherein the first gate electrode and the second gate electrode are in a same electric potential.

4. A semiconductor circuit comprising:
a first projection comprising a stripe shaped insulating film over an insulating surface;
a second projection comprising a stripe shaped insulating film over an insulating surface;
a first thin film transistor comprising;
  a first crystalline semiconductor film comprising a first channel forming region between the first and second projections; and
  a first gate electrode over the first crystalline semiconductor film with a gate insulating film therebetween;
a second thin film transistor comprising;
  a second crystalline semiconductor film comprising a second channel forming region between the first and second projections; and
  a second gate electrode over the second crystalline semiconductor film with the gate insulating film therebetween,
wherein the channel forming regions do not substantially include a crystal grain boundary,
wherein the first and second channel forming regions are aligned in the channel length direction thereof, and
wherein the first gate electrode and the second gate electrode are in a same electric potential.

5. A semiconductor circuit comprising:
a first projection comprising a stripe shaped insulating film over an insulating surface;
a second projection comprising a stripe shaped insulating film over an insulating surface;
a first thin film transistor comprising;
  a first crystalline semiconductor film comprising a first channel forming region between the first and second projections; and
  a first gate electrode over the first crystalline semiconductor film with a gate insulating film therebetween;
a second thin film transistor comprising;
  a second crystalline semiconductor film comprising a second channel forming region between the first and second projections; and
  a second gate electrode over the second crystalline semiconductor film with the gate insulating film therebetween,
wherein the channel forming regions do not substantially include a crystal grain boundary, and
wherein the same signal is simultaneously inputted as gate signals to the first thin film transistor and the second thin film transistor.

6. A semiconductor circuit comprising:
a first projection comprising a stripe shaped insulating film over an insulating surface;
a second projection comprising a stripe shaped insulating film over an insulating surface;
a first thin film transistor comprising;
  a first crystalline semiconductor film comprising a first channel forming region between the first and second projections; and
  a first gate electrode over the first crystalline semiconductor film with a gate insulating film therebetween;
a second thin film transistor comprising;
  a second crystalline semiconductor film comprising a second channel forming region between the first and second projections; and
  a second gate electrode over the second crystalline semiconductor film with the gate insulating film therebetween,
wherein the channel forming regions do not substantially include a crystal grain boundary;
wherein the first and second channel forming regions are aligned in the channel length direction thereof; and
wherein the same signal is simultaneously inputted as gate signals to the first thin film transistor and the second thin film transistor.

7. A semiconductor circuit according to claim 1, wherein the semiconductor circuit is one of a current mirror circuit and a differential amplifier circuit.

8. A semiconductor circuit according to claim 2, wherein the semiconductor circuit is one of a current mirror circuit and a differential amplifier circuit.

9. A semiconductor circuit according to claim 3, wherein the semiconductor circuit is one of a current mirror circuit and a differential amplifier circuit.

10. A semiconductor circuit according to claim 4, wherein the semiconductor circuit is one of a current mirror circuit and a differential amplifier circuit.

11. A semiconductor circuit according to claim 5, wherein the semiconductor circuit is one of a current mirror circuit and a differential amplifier circuit.

12. A semiconductor circuit according to claim 6 wherein the semiconductor circuit is one of a current mirror circuit and a differential amplifier circuit.

13. A semiconductor circuit according to claim 1, wherein the semiconductor circuit is one of an analogue switch and a source follower.

14. A semiconductor circuit according to claim 2, wherein the semiconductor circuit is one of an analogue switch and a source follower.

15. A semiconductor circuit according to claim 3, wherein the semiconductor circuit is one of an analogue switch and a source follower.

16. A semiconductor circuit according to claim 4, wherein the semiconductor circuit is one of an analogue switch and a source follower.

17. A semiconductor circuit according to claim 5, wherein the semiconductor circuit is one of an analogue switch and a source follower.

18. A semiconductor circuit according to claim 6, wherein the semiconductor circuit is one of an analogue switch and a source follower.

19. A semiconductor circuit according to claim 1, wherein channel widths of the first and second crystalline semiconductor films in the first and second channel forming regions are 0.01 $\mu$m or more and 2 $\mu$m or less.

20. A semiconductor circuit according to claim 2, wherein channel widths of the first and second crystalline semiconductor films in the first and second channel forming regions are 0.01 $\mu$m or more and 2 $\mu$m or less.

21. A semiconductor circuit according to claim 3, wherein channel widths of the first and second crystalline semiconductor films in the first and second channel forming regions are 0.01 $\mu$m or more and 2 $\mu$m or less.

22. A semiconductor circuit according to claim 4, wherein channel widths of the first and second crystalline semiconductor films in the first and second channel forming regions are 0.01 $\mu$m or more and 2 $\mu$m or less.

23. A semiconductor circuit according to claim 5, wherein channel widths of the first and second crystalline semiconductor films in the first and second channel forming regions are 0.01 $\mu$m or more and 2 $\mu$m or less.

24. A semiconductor circuit according to claim 6, wherein channel widths of the first and second crystalline semiconductor films in the first and second channel forming regions are 0.01 $\mu$m or more and 2 $\mu$m or less.

25. A semiconductor circuit according to claim 1, wherein the thicknesses of the first and second crystalline semiconductor films in the first and second channel forming regions are 0.01 μm or more and 3 μm or less.

26. A semiconductor circuit according to claim 2, wherein the thicknesses of the first and second crystalline semiconductor films in the first and second channel forming regions are 0.01 μm or more and 3 μm or less.

27. A semiconductor circuit according to claim 3, wherein the thicknesses of the first and second crystalline semiconductor films in the first and second channel forming regions are 0.01 μm or more and 3 μm or less.

28. A semiconductor circuit according to claim 4, wherein the thicknesses of the first and second crystalline semiconductor films in the first and second channel forming regions are 0.01 μm or more and 3 μm or less.

29. A semiconductor circuit according to claim 5, wherein the thicknesses of the first and second crystalline semiconductor films in the first and second channel forming regions are 0.01 μm or more and 3 μm or less.

30. A semiconductor circuit according to claim 6, wherein the thicknesses of the first and second crystalline semiconductor films in the first and second channel forming regions are 0.01 μm or more and 3 μm or less.

31. A semiconductor circuit according to claim 1, wherein the insulating surface comprises aluminum oxide.

32. A semiconductor circuit according to claim 2, wherein the insulating surface comprises aluminum oxide.

33. A semiconductor circuit according to claim 3, wherein the insulating surface comprises aluminum oxide.

34. A semiconductor circuit according to claim 4, wherein the insulating surface comprises aluminum oxide.

35. A semiconductor circuit according to claim 5, wherein the insulating surface comprises aluminum oxide.

36. A semiconductor circuit according to claim 6, wherein the insulating surface comprises aluminum oxide.

37. The semiconductor circuit according to claim 1, wherein the etching rate of the insulating films is faster than the etching rate of quartz under the same measuring condition.

38. The semiconductor circuit according to claim 2, wherein the etching rate of the insulating films is faster than the etching rate of quartz under the same measuring condition.

39. The semiconductor circuit according to claim 3, wherein the etching rate of the insulating films is faster than the etching rate of quartz under the same measuring condition.

40. The semiconductor circuit according to claim 4, wherein the etching rate of the insulating films is faster than the etching rate of quartz under the same measuring condition.

41. The semiconductor circuit according to claim 5, wherein the etching rate of the insulating films is faster than the etching rate of quartz under the same measuring condition.

42. The semiconductor circuit according to claim 6, wherein the etching rate of the insulating films is faster than the etching rate of quartz under the same measuring condition.

43. The semiconductor circuit according to claim 1, wherein the hardness of the insulating films is lower than that of quartz in the same measuring condition.

44. The semiconductor circuit according to claim 2, wherein the hardness of the insulating films is lower than that of quartz in the same measuring condition.

45. The semiconductor circuit according to claim 3, wherein the hardness of the insulating films is lower than that of quartz in the same measuring condition.

46. The semiconductor circuit according to claim 4, wherein the hardness of the insulating films is lower than that of quartz in the same measuring condition.

47. The semiconductor circuit according to claim 5, wherein the hardness of the insulating films is lower than that of quartz in the same measuring condition.

48. The semiconductor circuit according to claim 6, wherein the hardness of the insulating films is lower than that of quartz in the same measuring condition.

* * * * *